United States Patent
Yoon et al.

(10) Patent No.: US 9,984,562 B2
(45) Date of Patent: May 29, 2018

(54) REMOTE CONTROLLER HAVING TILT SWITCH AND A PLURALITY OF METAL DOMES

(71) Applicant: SAMSUNG ELECTRONICS CO., LTD., Suwon-si (KR)

(72) Inventors: Eui Shik Yoon, Suwon-si (KR); Sung Hyuk Kwon, Suwon-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days. days.

(21) Appl. No.: 15/453,999

(22) Filed: Mar. 9, 2017

(65) Prior Publication Data

US 2017/0263114 A1    Sep. 14, 2017

(30) Foreign Application Priority Data

Mar. 10, 2016   (KR) .................. 10-2016-0029112

(51) Int. Cl.
*G08C 17/02*    (2006.01)
*H05K 5/02*    (2006.01)
*H05K 5/00*    (2006.01)
*H04N 21/422*    (2011.01)
*H04N 5/44*    (2011.01)

(52) U.S. Cl.
CPC ......... *G08C 17/02* (2013.01); *H04N 21/4221* (2013.01); *H05K 5/0017* (2013.01); *H05K 5/0217* (2013.01); *H01H 2221/016* (2013.01); *H04N 5/4403* (2013.01); *H04N 21/42204* (2013.01)

(58) Field of Classification Search
None
See application file for complete search history.

(56) References Cited

U.S. PATENT DOCUMENTS 5,619,021 A * 4/1997 Yamamoto et al.
.......................... G05G 9/04796
200/6 A
5,691,517 A * 11/1997 Yamamoto et al.
.......................... G05G 9/04796
200/6 A (Continued)

FOREIGN PATENT DOCUMENTS

| KR | 10-2013-0091208 A | 8/2013 |
| WO | 03/030092 A1 | 4/2003 |
| WO | 03/090008 A2 | 10/2003 |

OTHER PUBLICATIONS

Communication dated Jul. 18, 2017, from the European Patent Office in counterpart European Application No. 17159938.4.

*Primary Examiner* — Craig A. Renner
(74) *Attorney, Agent, or Firm* — Sughrue Mion, PLLC

(57) ABSTRACT

A remote controller includes a housing including a through-hole, a tilt switch accommodated in the housing and including first to fourth extending portions extending in different directions, a rubber including a first protrusion and a second protrusion protruding in a direction opposite to a protruding direction of the first protrusion, a plurality of metal domes that are in contact with one surface of the second protrusion in response to the user's input, and a plurality of contacts mounted on a printed circuit board and located under the plurality of metal domes and each of the plurality of contacts is in contact with a metal dome of the plurality of metal domes in response to the user's input.

18 Claims, 15 Drawing Sheets

(56) References Cited

U.S. PATENT DOCUMENTS

| | | | |
|---|---|---|---|
| 5,744,765 A * | 4/1998 | Yamamoto | G05G 9/04796 200/6 A |
| 6,080,941 A * | 6/2000 | Yokobori | G05G 9/047 200/6 A |
| 6,162,999 A * | 12/2000 | Ishikawa et al. | H01H 25/041 200/6 A |
| 6,593,909 B1 * | 7/2003 | Chou | G05G 9/047 200/6 A |
| 6,717,572 B1 | 4/2004 | Chou et al. | |
| 2001/0006143 A1 * | 7/2001 | Sato | H01H 25/041 200/6 A |
| 2001/0047926 A1 * | 12/2001 | Kozuma | H01H 25/04 200/6 A |
| 2004/0084289 A1 * | 5/2004 | Takeuchi et al. | H01H 25/04 200/1 R |

* cited by examiner

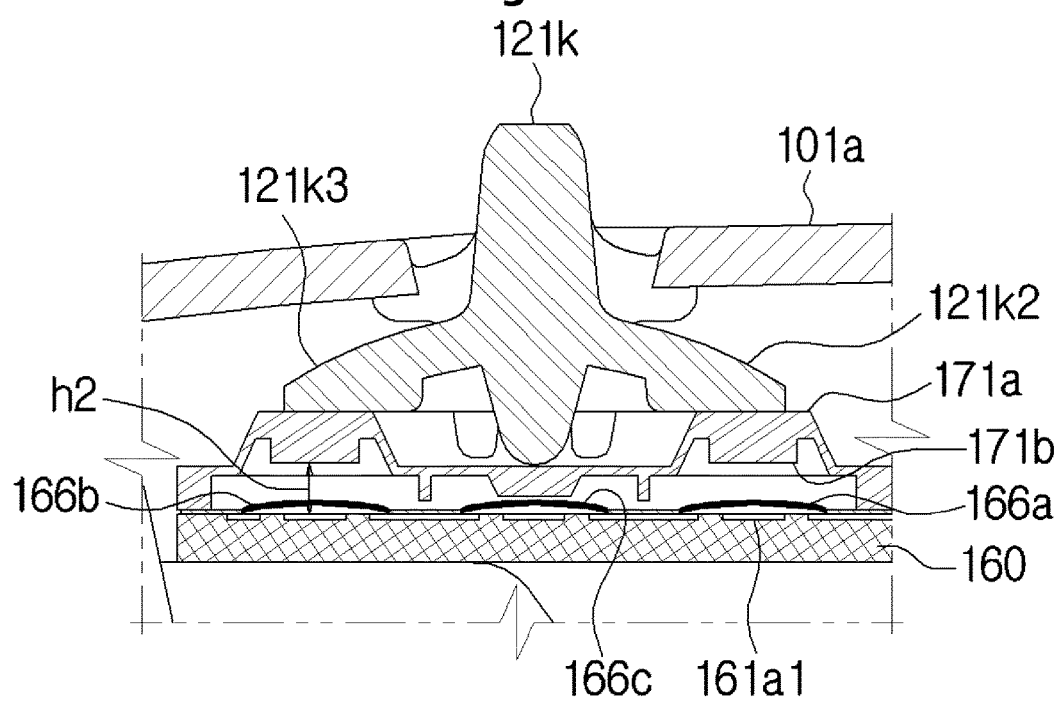

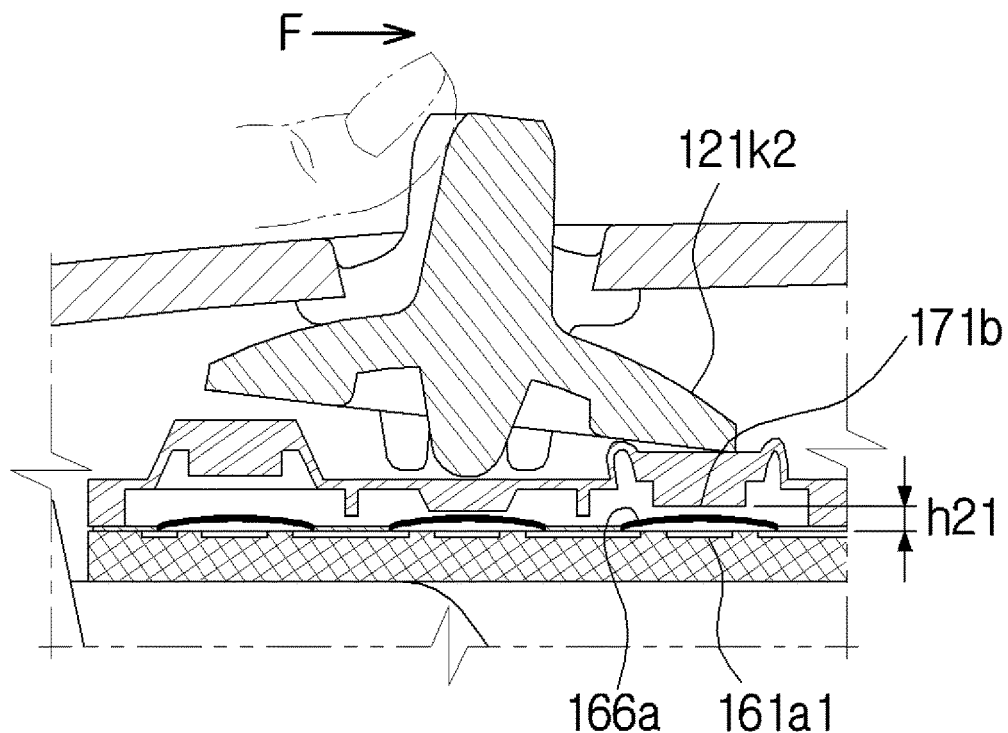

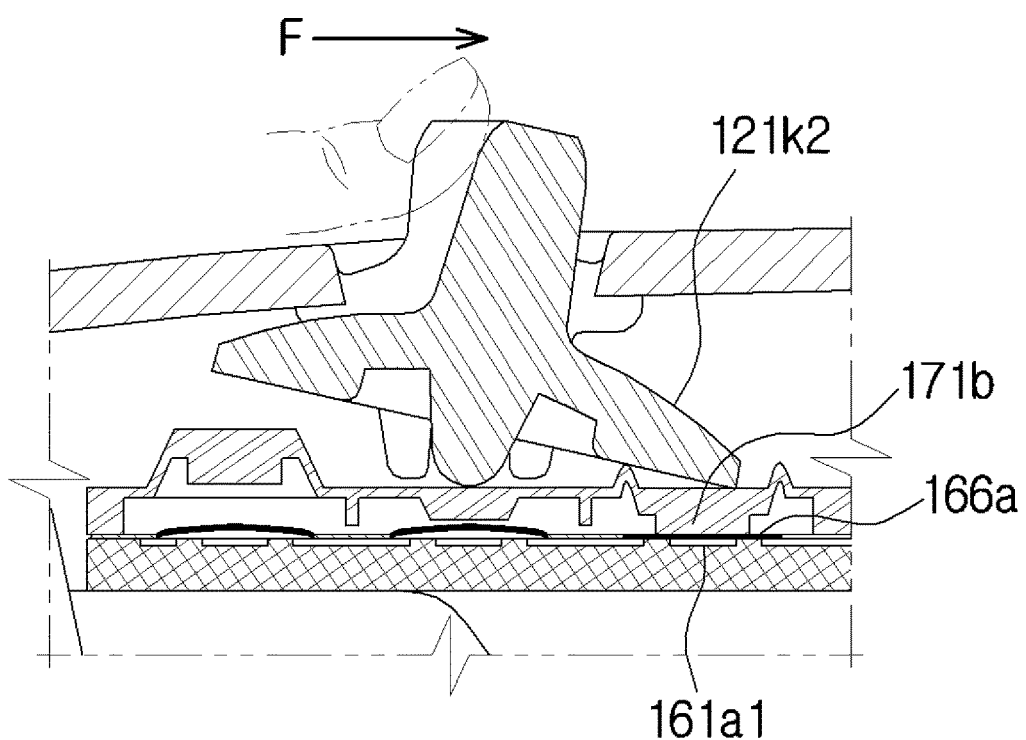

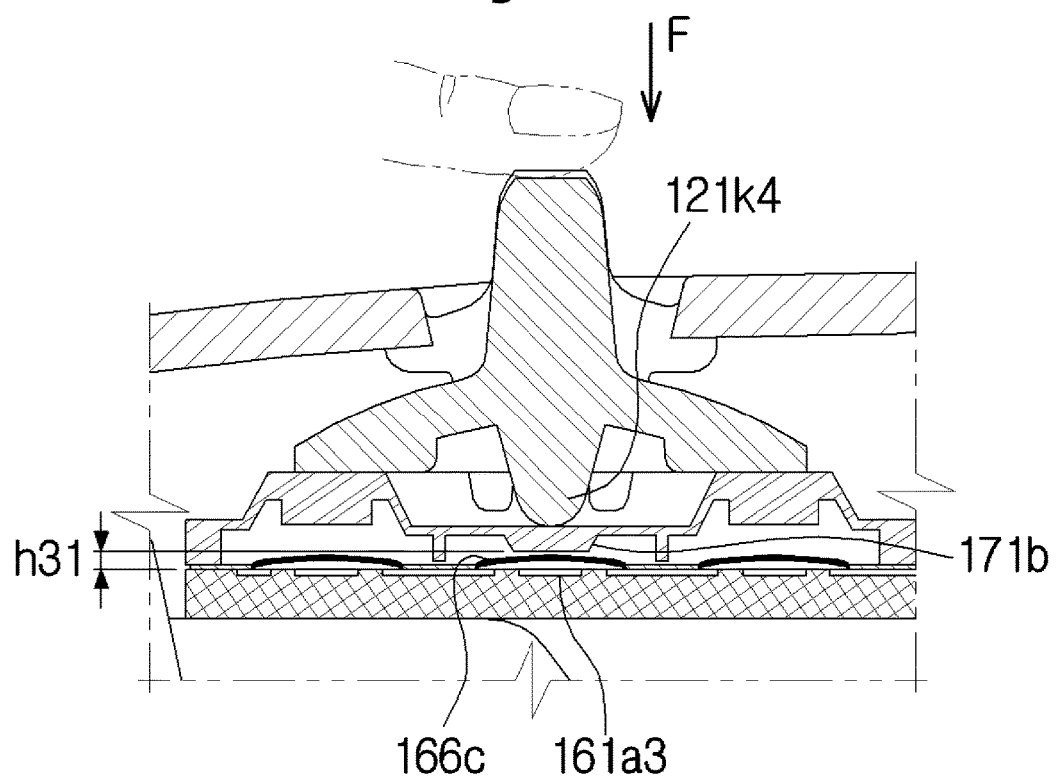

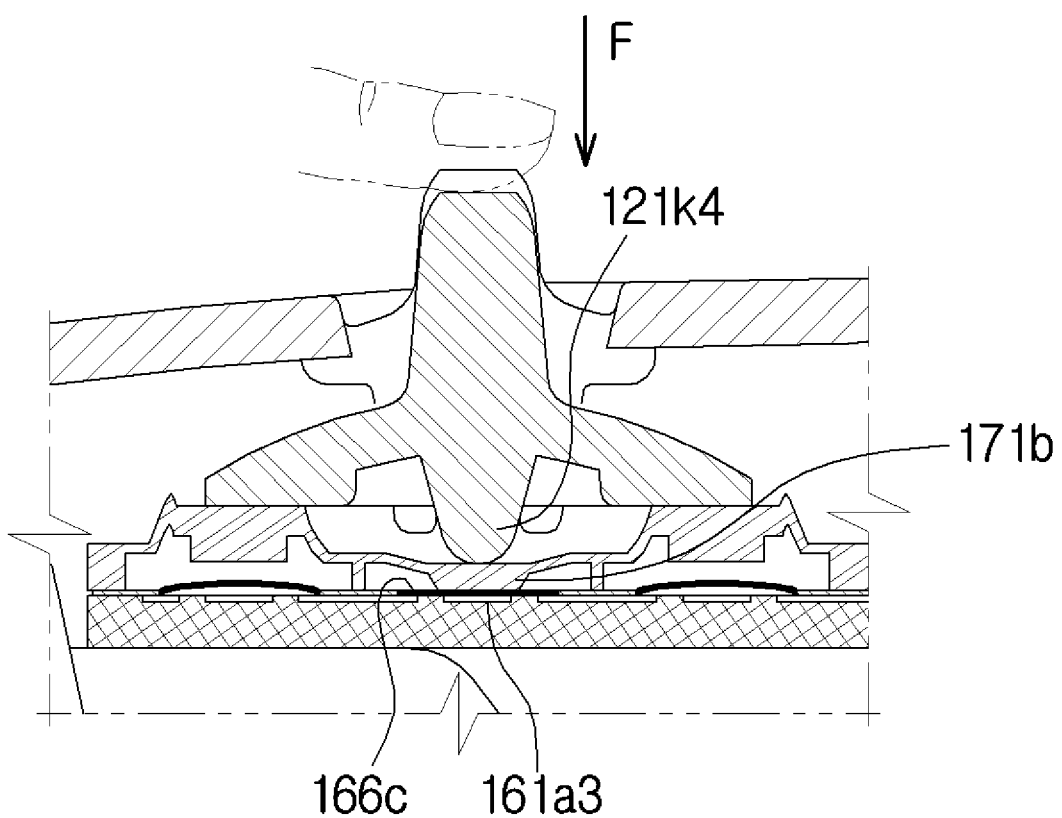

REMOTE CONTROLLER HAVING TILT SWITCH AND A PLURALITY OF METAL DOMES

CROSS-REFERENCE TO RELATED APPLICATION

This application claims the benefit of Korean Patent Application No. 10-2016-0029112, filed on Mar. 10, 2016 in the Korean Intellectual Property Office, the disclosure of which is incorporated herein by reference.

BACKGROUND

1. Field

Embodiments of the present disclosure relate to a remote controller, and more particularly, to a remote controller in which a tilt switch is applied to the remote controller connected to a display device for displaying content and which may control at least one of functions of controlling a corresponding channel of the display device and an increase and a decrease in a volume thereof using a multi-directional tilt switch.

2. Description of the Related Art

A panel key of a display device or a remote controller is mainly used as an interface method between the display device and a user. A function of the display device is complicated and diversified along with a technological advancement and thus may execute content such as a video downloaded from an outside or may allow Internet browsing.

It is not easy for a user to remotely control an operation of the display device providing complex and various functions using a remote controller having a small size and a limited number of buttons.

A method of using a remote controller having a small number of buttons like a remote controller having a large number of buttons is required.

SUMMARY

Therefore, it is an aspect of the present disclosure to provide a remote controller which can control the display device using a tilt switch.

Additional aspects of the disclosure will be set forth in part in the description which follows and, in part, will be obvious from the description, or may be learned by practice of the disclosure.

In accordance with an aspect of the present disclosure, a remote controller comprises a housing including a through-hole, a tilt switch accommodated in the housing and including a first extending portion extending in a direction configured to receive a user's input, a second extending portion extending and protruding in a direction different from the direction of the first extending portion, a third extending portion extending and protruding in a direction different from the direction of the second extending portion, and a fourth extending portion extending and protruding in a direction different from the direction of the first extending portion, a rubber located under the second extending portion, the third extending portion and the fourth extending portion and including a first protrusion formed at positions opposite to the second extending portion and the third extending portion to protrude and a second protrusion protruding in a direction opposite to a protruding direction of the first protrusion, a plurality of metal domes located under the second protrusion and configured to be in contact with one surface of the second protrusion, and a plurality of contacts mounted on a printed circuit board, located under the plurality of metal domes and configured to be in contact with the other surfaces of the plurality of metal domes, wherein a part of the first extending portion is exposed to an outside through the through-hole.

The tilt switch further includes a rotational shaft and is inclined with respect to the rotational shaft by the user's input.

A tiltable angle of the tilt switch is determined by one of a width of the through-hole, a height of the first protrusion and a height between the second protrusion and the contact.

A protruding direction of the fourth extending portion is opposite to that of the first extending portion.

A height of the first protrusion of the rubber is different from that of the second protrusion.

The first protrusion includes a plurality of protrusions corresponding to the second extending portion and the third extending portion, respectively.

The second protrusion includes a plurality of protrusions corresponding to the second extending portion, the third extending portion and the fourth extending portion, respectively.

When the tilt switch is inclined by the user's input received through the first extending portion and a first metal dome of the plurality of metal domes corresponding to the second extending portion and a first contact of the plurality of contacts corresponding to the first metal dome are in contact with each other, the fourth extending portion is spaced apart from a third metal dome of the plurality of metal domes corresponding to the fourth extending portion.

When the tilt switch is inclined by the user's input received through the first extending portion and a second metal dome of the plurality of metal domes corresponding to the third extending portion and a second contact of the plurality of contacts corresponding to the second metal dome are in contact with each other, the fourth extending portion is spaced apart from a third metal dome of the plurality of metal domes corresponding to the fourth extending portion.

When the tilt switch is moved by the user's input received through the first extending portion and a third metal dome of the plurality of metal domes corresponding to the fourth extending portion and a third contact of the plurality of contacts corresponding to the third metal dome are in contact with each other, the second extending portion is spaced apart from the first metal dome of the plurality of metal domes, and the third extending portion is spaced apart from the second metal dome of the plurality of metal domes.

A thickness of the rubber is greater than that of the metal dome.

The second extending portion of the tilt switch is inclined by the user's input received through the first extending portion and presses a first protrusion corresponding to the second extending portion.

The third extending portion of the tilt switch is inclined by the user's input received through the first extending portion and presses a first protrusion corresponding to the third extending portion.

A function of a display device corresponding to the fourth extending portion is different from a function of the display device corresponding to the second extending portion and a function of the display device corresponding to the third extending portion.

In accordance with an aspect of the present disclosure, a remote controller comprises a housing including a through-hole, a tilt switch installed at the housing to be tilted and linearly moved and including an extending portion of which at least a part extends in a direction to an outside of the housing through the through-hole and a first pressing portion, a second pressing portion and a third pressing portion extending in the housing in directions different from the direction of the extending portion, a rubber located under the tilt switch to be pressed by at least one of the first pressing portion, the second pressing portion and the third pressing portion according to movement of the tilt switch, a first metal dome, a second metal dome and a third metal dome located under the rubber so that one surface of each of the metal domes is contactable with the rubber and corresponding to the first pressing portion, the second pressing portion and the third pressing portion, respectively, and a first contact, a second contact and a third contact located under the metal domes to correspond to the first metal dome, the second metal dome and the third metal dome, respectively, wherein the first pressing portion presses the rubber in response to tilting of the tilt switch so that the first metal dome is in contact with the first contact, and the third pressing portion presses the rubber so that the third metal dome is in contact with the third contact when the tilt switch is linearly moved.

The tilt switch further includes a rotational shaft, and the first pressing portion and the second pressing portion extend in opposite directions to each other with respect to the rotational shaft, and the third pressing portion extends between the first pressing portion and the second pressing portion in a direction opposite to the direction of the extending portion.

The rubber includes a first protrusion located to correspond to the first pressing portion and protruding toward the first metal dome, a second protrusion located to correspond to the second pressing portion and protruding toward the second metal dome and a third protrusion located to correspond to the third pressing portion and protruding toward the third metal dome.

A distance between the third protrusion and the third contact is shorter than a distance between the first protrusion and the first contact.

When the tilt switch is linearly moved, the first metal dome of the tilt switch is spaced apart from the first contact.

In accordance with an aspect of the present disclosure, a remote controller comprises a housing including a through-hole, a tilt switch configured to receive a user's input and having a main extending portion extending in a direction and disposed to protrude to an outside of the housing and a plurality of sub-extending portions extending in directions different from the direction of the main extending portion and built in the housing, a non-conductive elastic portion including a protrusion located at a lower end of each of the plurality of sub-extending portions and formed at a position facing each of the plurality of sub-extending portions, a conductive elastic portion disposed at a lower end of the non-conductive elastic portion, formed at a position facing the protrusion and configured to be in contact with a surface of the protrusion, and a printed circuit board disposed at a lower end of the conductive elastic portion and on which a plurality of contacts disposed at positions opposite to the conductive elastic portion and a plurality of electronic components are mounted, wherein the non-conductive elastic portion, the conductive elastic portion and the printed circuit board are disposed, in turn, at lower ends of the sub-extending portions in the housing.

BRIEF DESCRIPTION OF THE DRAWINGS

These and/or other aspects of the disclosure will become apparent and more readily appreciated from the following description of the embodiments, taken in conjunction with the accompanying drawings of which:

FIGS. 6A-6C are schematic views illustrating a first motion of the tilt switch of the remote controller according to the embodiment of the present disclosure.

FIGS. 8A-8C are schematic views illustrating a third operation of the tilt switch of the remote controller according to the embodiment of the present disclosure.

DETAILED DESCRIPTION

Figure 1:
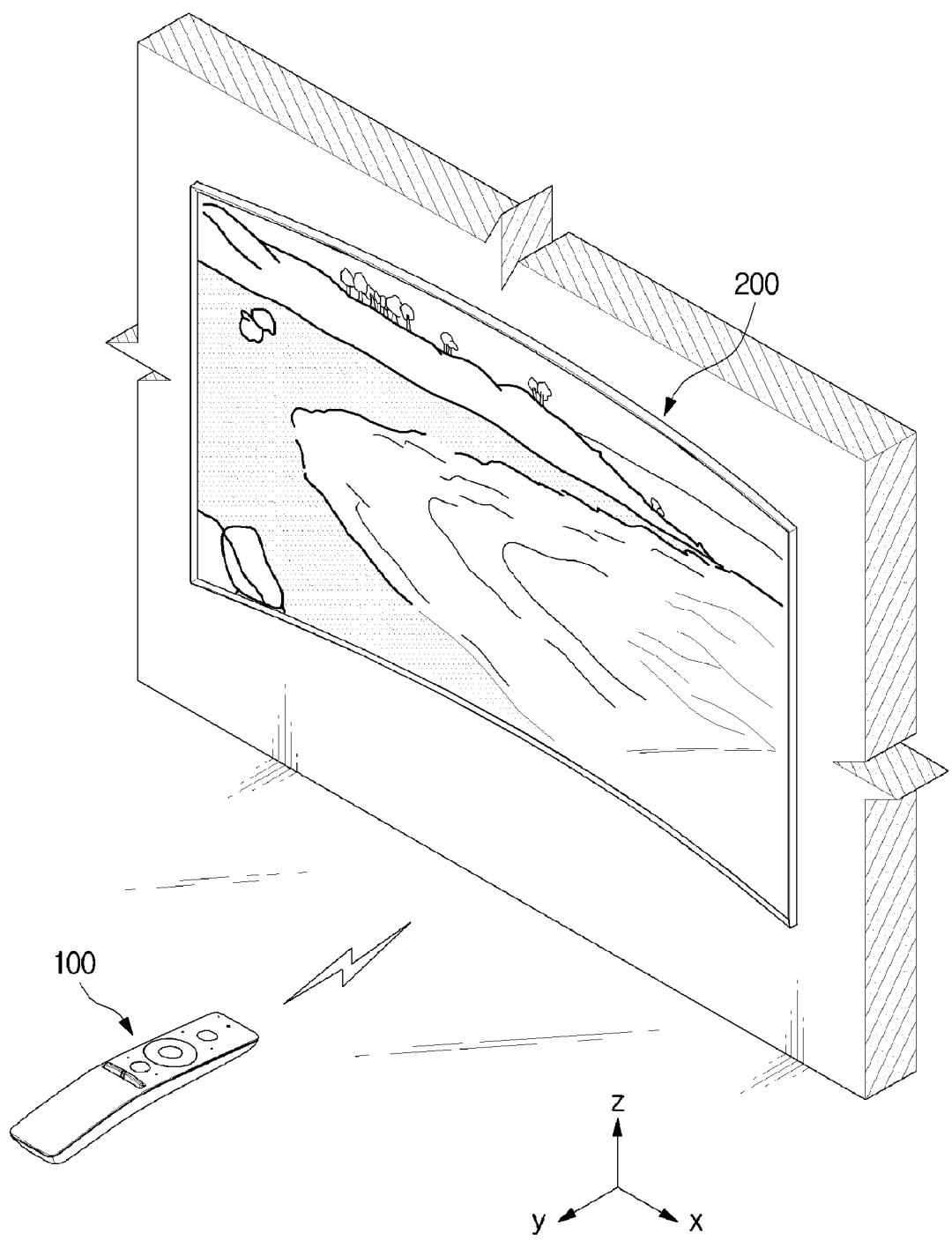
FIG. 1 is a schematic view illustrating an operation between a remote controller and a display device according to an embodiment of the present disclosure.

Hereinafter, exemplary embodiments of the present disclosure will be described in detail with reference to the accompanying drawings. Also, a method of manufacturing and using an electronic device according to an embodiment of the present disclosure will be described in detail with reference to the accompanying drawings. Like reference numerals refer to like or corresponding elements throughout the drawings.

Terms including ordinal numbers such as "first," "second," etc. can be used to describe various components, but the components are not limited by those terms. The terms are used merely for the purpose of distinguishing one component from another. For example, a first component may be called a second component, and similarly, a second component may be called a first component without departing from the scope of rights of the disclosure. The term "and/or" encompasses combinations of a plurality of items or any one of the plurality of items.

In the embodiment of the present disclosure, a "selection of a button (or a key)" in a remote controller 100 (referring to FIG. 1) may be a "pressing of the button (or the key) or a touching of the button (or the key)". Also, a "selection of a switch" in the remote controller 100 may be a pressing of the switch or a tilting of the switch in a direction (e.g., a −y axial direction) toward a display device 200 (referring to FIG. 1) and a direction (e.g., a y axial direction) opposite to the display device 200.

A user's input may include a user's selection of the button (or the key), a user's pressing of the button (or the key), a user's touching of the button, a user's pressing of the switch, a user's tilting of the switch, a user's touch gesture, a user's voice and a user's motion. Also, the touching (including the touch gesture) in the remote controller 100 may be input by a user's body or an input pen (e.g., a stylus (not shown)).

In the embodiment of the present disclosure, a screen of the display device may include a display part of the display device.

The terms used herein are merely to describe a specific embodiment, and do not limit the present disclosure. Further, unless the context clearly indicates otherwise, singular expressions should be interpreted to include plural expressions. It is understood that terms "comprises," "comprising," "includes" or "has" are intended to indicate the presence of features, numerals, steps, operations, elements and components described in the specification or the presence of combinations of these, and do not preclude the presence of one or more other features, numerals, steps, operations, elements and components, the presence of combinations of these, or additional possibilities.

Like reference numerals refer to like or corresponding elements throughout the drawings.

FIG. 1 is a schematic view illustrating an operation between a remote controller and a display device according to an embodiment of the present disclosure.

In FIG. 1, the remote controller 100 and the display device 200 are illustrated.

In the embodiment of the present disclosure, the remote controller 100 may be an electronic device which may control the display device 200. The remote controller 100 may include an electronic device which may install a separate application (not shown) for controlling the display device 200 (or may download and then install the application from a server).

Figure 2A:
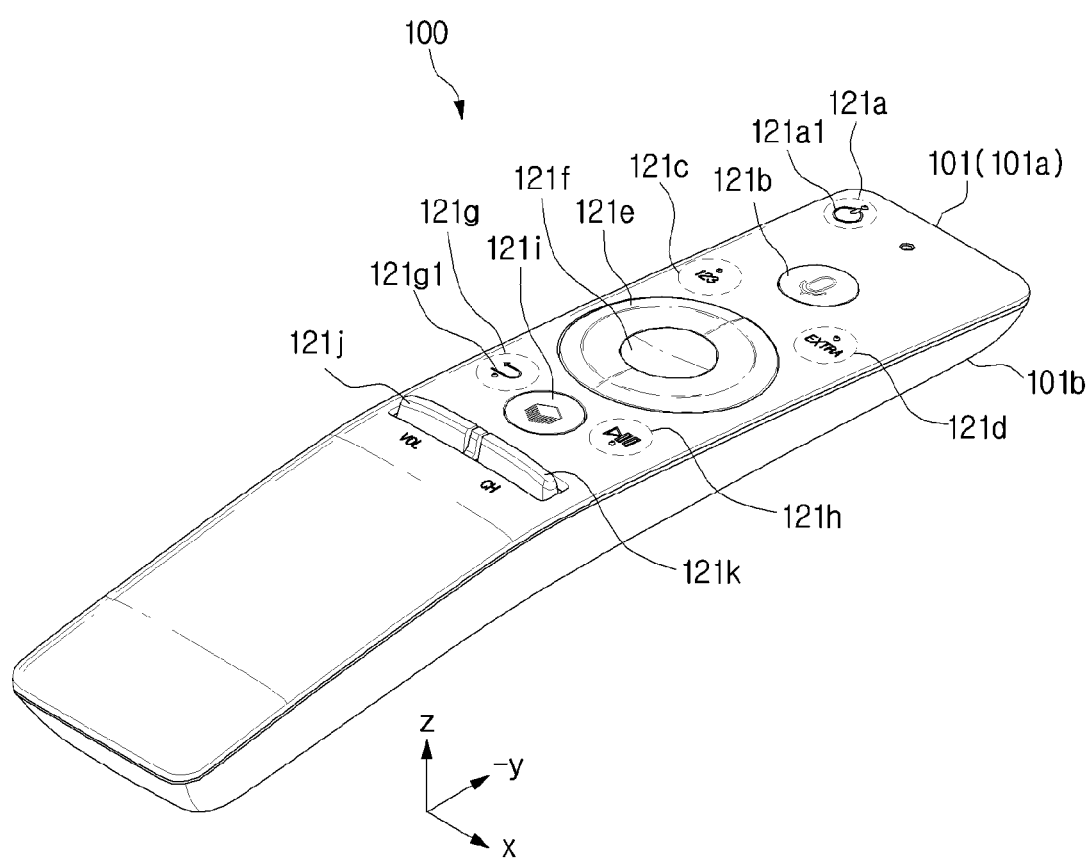
FIG. 2A is a schematic perspective view illustrating the remote controller according to the embodiment of the present disclosure.
Figure 2B:
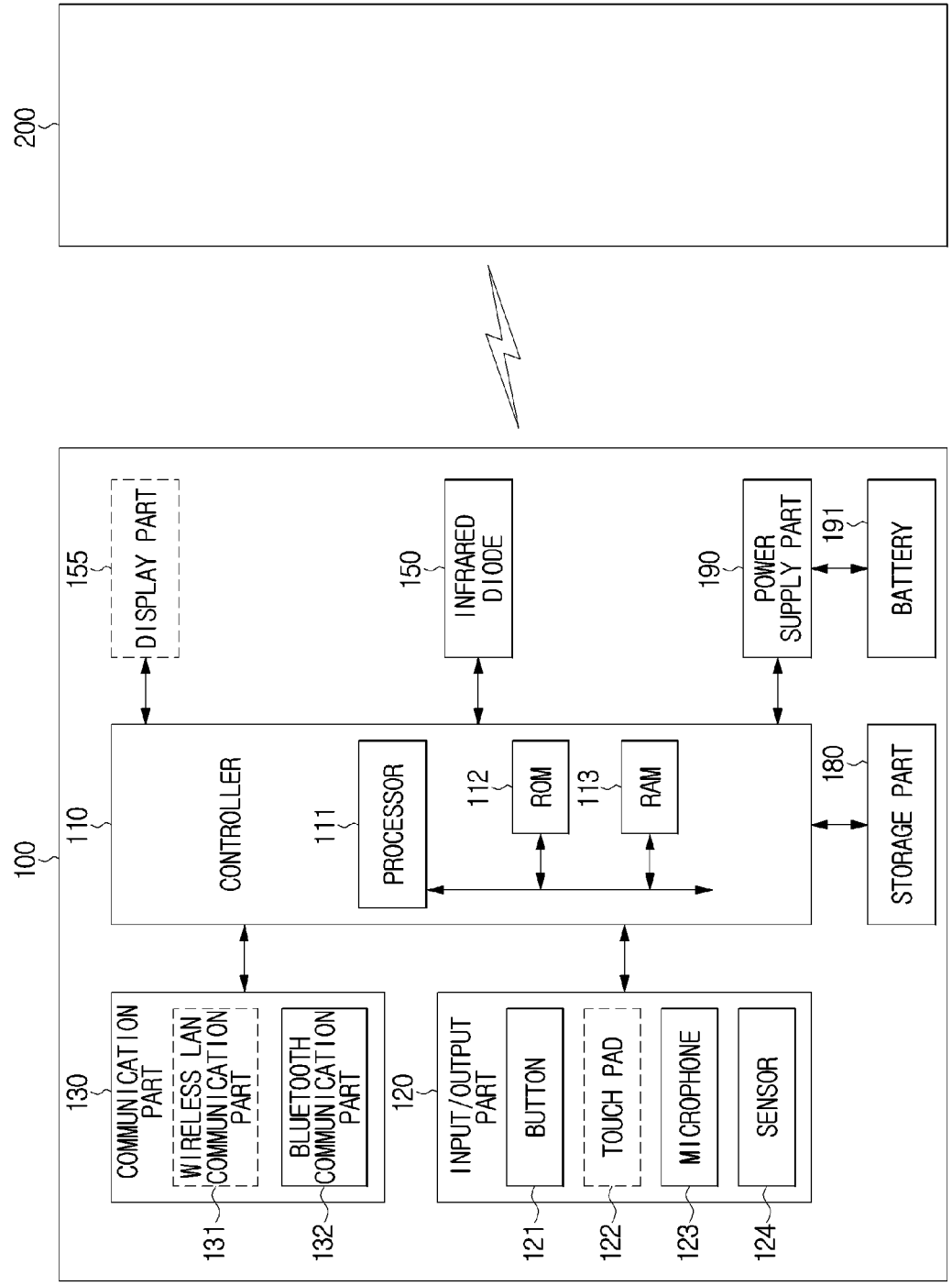
FIG. 2B is a schematic block diagram illustrating the remote controller according to the embodiment of the present disclosure.

The electronic device which may install the application (not shown) for controlling the display device 200 may have a display part 155 (having only a display panel without a touch screen or a touch panel, referring to FIG. 2B). The electronic device having the display part 155 may include a cell phone (not shown), a smart phone (not shown), a tablet PC (not shown), a note PC (not shown), other display device (not shown) and a home appliance (e.g., a refrigerator, a washing machine, a cleaner or the like). A user may control the display device 200 using a function key (for example, a channel key, not shown) in a graphic user interface (GUI, not shown) provided in the application.

The remote controller 100 may remotely control the display device 200 by transmitting a control command to the display device 200 through unidirectional communication such as infrared or bidirectional communication such as local area communication including Bluetooth (including Bluetooth low energy).

The user may control a function (e.g., turning on/off of power, changing of a channel, adjusting of a volume, executing of an application, replaying of content or the like) of the display device 200 using a button (including a key), a touch pad, voice recognition through a microphone or motion recognition through a sensor located at the remote controller 100. Also, the user may control the function (e.g., the turning on/off of the power, the changing of the channel, the adjusting of the volume, the executing of the application, the replaying of the content or the like) of the display device 200 using the motion recognition through a camera (not shown) attached to the display device 200.

The user may change a channel (e.g., up and down) of the display device 200 which is displaying a broadcast by operating (e.g., tilting) one (one of 121*k* and 121*j*, e.g., 121*k*, referring to FIG. 2A) of a plurality of tilt switches of the remote controller 100. Also, the user may change a channel of a screen of the display device 200 which is displaying the broadcast by operating (e.g., tilting) one tilt switch 121*k* of the remote controller 100 or may display additional information (e.g., an electronic program guide (EPG)) on the screen thereof.

The user may change (e.g., increase or decrease) the volume of the display device 200 which is displaying the broadcast by operating (e.g., tilting) another tilt switch (one of 121*j* and 121*k*, e.g., 121*j*, referring to FIG. 2A) of the remote controller 100. Also, the user may change or mute the volume of the display device 200 which is displaying the broadcast by operating (e.g., tilting) another tilt switch 121*j* of the remote controller 100.

A function corresponding to an extending portion of each (one of 121*k* and 121*j*) of the plurality of tilt switches may be changed by a setting. The function corresponding to the extending portion of each (one of 121*k* and 121*j*) of the plurality of tilt switches may be changed by a source of output content. For example, when a set-top box (not shown) is connected to the display device 200 and the tilt switch 121*k* of the remote controller 100 is operated (e.g., pressed) by the user, the additional information (e.g., the EPG) of the set-top box (not shown) may be displayed on the screen of the display device 200.

FIG. 2A is a schematic perspective view illustrating the remote controller according to the embodiment of the present disclosure.

Referring to FIG. 2A, the remote controller 100 includes a housing 101. Various electronic components (not shown) necessary for an operation of the remote controller 100 may be built in the housing 101.

The housing 101 may be formed of a synthetic resin material (e.g., plastic or the like) or a metallic material (e.g., aluminum, magnesium or the like). Also, the housing 101 may be formed of the synthetic resin material and the partial metallic material or may be formed of the metallic material and the partial synthetic resin material.

The remote controller 100 may include a controller 110 for controlling the operation of the remote controller 100 and a battery 191 for supplying power to the remote controller 100 which are disposed in the housing 101.

In the remote controller 100, one or two or more buttons 121*a* to 121*i* corresponding to the function of the display device 200 may be located at a first housing 101*a* of the housing 101. The one or two or more buttons 121*a* to 121*i* may include a physical (or mechanical) button or a touch bottom. Also, some of the buttons 121*a* to 121*i* may be located at a second housing 101*b*, which will be described below, of the housing 101. The button 121 (referring to FIG. 2B) may include the tilt switch 121*k* or 121*j*.

The remote controller 100 may include mono-function buttons (e.g., 121*a* to 121*i*) corresponding to a function executed in the display device 200 and/or a multi-function button (not shown).

The mono-function buttons (e.g., a power button 121*a* and so on) of the remote controller 100 may be buttons corresponding to controlling of only one function of various functions executed in the display device 200. Most of the buttons located at the remote controller 100 may be the mono-function buttons.

The multi-function button (e.g., a color key, not shown) of the remote controller 100 may be a button corresponding to controlling of an additional function differently provided (or set) according to the functions executed in the display device 200. Color buttons (not shown) may include a red button (not shown), a green button (not shown), a yellow button (not shown) and a blue button (not shown). An arrangement order of the color buttons may be changed, and the number of color buttons may be added, altered or removed to correspond to the functions of the display device 200.

The remote controller 100 may perform a plurality of functions in the display device 200 using the one 121*j* or 121*k* or the plurality of tilt switches. For example, the remote controller 100 may change (increase and decrease) and mute the volume of the display device 200 using the first tilt switch 121*j*. Also, the remote controller may change the channel (up and down) of the display device 200 and may display the additional information (e.g., the EPG or the like) using the second tilt switch 121*k*.

In the remote controller 100, the one 121*j* or 121*k* or the plurality of tilt switches may be located at a lower end further than the buttons 121*a* to 121*i* (e.g., in a −z axial direction).

The remote controller 100 may include an LED light emitted to correspond to one of an operation and a state of the remote controller 100.

FIG. 2B is a schematic block diagram illustrating the remote controller according to the embodiment of the present disclosure.

Referring to FIG. 2B, the remote controller 100 includes the controller 110, a communication part 130, a light output part 150 (e.g., an infrared diode), an input/output part 120, the display part 155, a storage part 180 and a power supply part 190. The remote controller 100 may include one of the communication part 130 and the infrared diode 150. Also, the remote controller 100 may not include the storage part 180.

The controller 110 may include a processor 111, a ROM 112 (or a non-volatile memory) in which a control program for controlling the remote controller 100 and a RAM 113 (or a volatile memory) used to store a signal or data input from an outside of the remote controller 100 or used as a storage area for various operations performed in the remote controller 100.

The controller 110 performs a function of controlling an entire operation of the remote controller 100 and a signal flow among internal elements 130 to 190 and also processing data. The controller 110 controls the power supplied from the battery 191 to be supplied to the internal elements 130 to 190 using the power supply part 190. Also, the processor 111, the ROM 112 and the RAM 113 may be connected to each other through an internal bus.

The controller 110 may output a control signal corresponding to a selection of a button 121 to an outside using one of the communication part 130 and the infrared diode 150. Also, the controller 110 may control first control information (corresponding to a pressing of, for example, a second extending portion 121*k*2), second control information (corresponding to a pressing of, for example, a third extending portion 121*k*3) and third control information (corresponding to a pressing of, for example, a fourth extending portion 121*k*4) corresponding to a selection of a 3-way tilt switch 121*k* or 121*j* (e.g., 121*k*) to be transmitted to the display device 200 through one of the communication part 130 and the infrared diode 150.

The controller 110 may control second extending portion selection information corresponding to a selection of the second extending portion 121*k*2, third extending portion selection information corresponding to a selection of the third extending portion 121*k*3 and fourth extending portion selection information corresponding to a selection of the fourth extending portion 121*k*4 to be stored in the storage part 180.

In the embodiment of the present disclosure, the controller of the remote controller may include the processor 111, the ROM 112 and the RAM 113 of the remote controller 100.

By controlling of the controller 110, the communication part 130 may transmit control information (e.g., control information corresponding to turning-on/off of the power, or the like) corresponding to a user's input (e.g., a pressing or the like) to the display device 200 as a control target. The communication part 130 may be wirelessly connected with the display device 200 by the controlling of the controller 110. The communication part 130 may include one of a wireless LAN communication part 131 and a Bluetooth communication part 132 or may include all of the wireless LAN communication part 131 and the Bluetooth communication part 132.

By the controlling of the controller 110, the wireless LAN communication part 131 may be wirelessly connected to an access point (AP) at a place at which the AP is installed. The wireless LAN communication part 131 may include, for example, a Wi-Fi communication part. The wireless LAN communication part 131 supports the wireless LAN standard (IEEE802.11x) of the Institute of Electrical and Electronics Engineers (IEEE). Also, the Bluetooth communication part 132 may allow wireless communication between the remote controller 100 and the display device 200 without the AP by the controlling of the controller 110. The communication part 130 may include not only the Bluetooth communication part 132 but also a local area communication part (e.g., Bluetooth low energy, infrared data association (IrDA), ultra-wideband (UWB), near field communication (NFC) or the like).

The infrared diode 150 outputs a light signal (e.g., including the control information) corresponding to the user's input (e.g., the pressing of the button, the pressing (or tilting) of the tilt switch or the like) to a light receiving part (not shown) of the display device 200 by the controlling of the controller 110. The infrared diode 150 may include an infrared-light emitting diode (IR-LED).

The light signal may be output to the display device 200 according to a remote control data format (or a remote control code format) of the remote controller 100. The light signal output from the infrared diode 150 may be output in a modulated state with a carrier wave. The control information may be stored in the storage part 180 or may be generated by the controller 110.

One of a remote control code format only for a manufacturer and a commercial remote control code format may be used as the remote control data format used in the remote controller 100.

It may be easily understood by those skilled in the art that the above-described remote control data format is just an example and may be varied according to a manufacturer and/or an electronic device.

The input/output part 120 may include the button 121 or a touch pad 122 for receiving a user's input (e.g., the pressing of the button or the pressing (or the tilting) of the tilt switch) for controlling the display device 200. The input/output part 120 may include a microphone 123 for receiving a user's articulated voice and a sensor 124 for detecting a motion of the remote controller 100 or a vibration motor (not shown) for providing haptic feedback.

The button 121 may include buttons 121*a* to 121*i* or a switch 121*k* or 121*j* of FIG. 2A.

The touch pad 122 may receive a user's touch or a user's touch gesture.

The microphone 123 receives a user's voice. The microphone 123 may convert the received voice into an electric signal and then may output the electric signal to the controller 110.

For example, the sensor 124 may include a motion sensor (not shown) for detecting a motion of the remote controller 100, a gyro sensor (not shown) for detecting a direction using rotational inertia of the remote controller 100, an acceleration sensor (not shown) for detecting an acceleration of each of three axes (e.g., an x axis, a y axis and a z axis) applied to the remote controller 100, or a gravitational sensor (not shown) for detecting a gravitational action direction.

The vibration motor (not shown) may convert the electric signal into a mechanical vibration according to the controlling of the controller 110. For example, the vibration motor (not shown) may include a linear vibration motor, a bar type vibration motor, a coin type vibration motor or a piezoelectric element vibration motor.

For example, the display part 155 may include a liquid crystal display (LCD) type, an organic light emitting diodes (OLED) type, a plasma display panel (PDP) type or a vacuum fluorescent display (VFD) type. Also, the display part 155 may be a touch screen.

The display part 155 may display a text, an icon and/or a symbol corresponding to the received user's input (e.g., the pressing).

The storage part 180 may store various data, programs or applications for driving and controlling the remote controller 100 by the controlling of the controller 110. The storage part 180 may store an input or output signal or data corresponding the driving of the communication part 130, the infrared diode 150 and the power supply part 190.

The storage part 180 may store the control information corresponding to the user's input (e.g., the touching, the pressing, the tilting, the touch gesture, the voice or the motion) received by the controlling of the controller 110. Also, the storage part 180 may store the remote control data format corresponding to the control information by the controlling of the controller 110.

The storage part 180 may store remote controller information corresponding to the remote controller 100. The remote controller information may include a model name, its own device ID, a memory residual value, presence or absence of object data, a Bluetooth version or a Bluetooth profile.

The storage part 180 may store the first control information (corresponding to the pressing of, for example, the second extending portion 121$k$2), the second control information (corresponding to the pressing of, for example, the third extending portion 121$k$3) and the third control information (corresponding to the pressing of, for example, the fourth extending portion 121$k$4) corresponding to the selection of the tilt switch 121$k$ or 121$j$ (e.g., 121$k$) by the controlling of the controller 110.

The storage part 180 may store the second extending portion selection information corresponding to the selection of the second extending portion 121$k$2, the third extending portion selection information corresponding to the selection of the third extending portion 121$k$3 and the fourth extending portion selection information corresponding to the selection of the fourth extending portion 121$k$4 by the controlling of the controller 110.

The power supply part 190 supplies the power supplied from the battery 191 to the elements 130 to 190 of the remote controller 100 by the controlling of the controller 110. The power supply part 190 may supply the power from one or two or more batteries (not shown) located at the remote controller 100 to the elements 130 to 190. The battery 191 may be located at an inside between the first housing 101$a$ and the second housing 101$b$ of the housing 101.

In the elements shown in the remote controller 100 of FIGS. 1 to 2B, at least one element may be added, altered (e.g., at least one of boxes illustrated with a dotted line) or removed (e.g., at least one of boxes illustrated with a dotted line) to correspond to performance of the remote controller 100. Also, it may be easily understood by those skilled in the art that positions of the elements may be changed to correspond to the performance or a structure of the remote controller 100.

FIG. 2B illustrates that the remote controller 100 includes all of the infrared diode 150 and the communication part 130. However, when the remote controller 100 is implemented to transmit the control information in an IR method, the infrared diode 150 may be included and the communication part 130 may be omitted, and vice versa.

Figure 3:
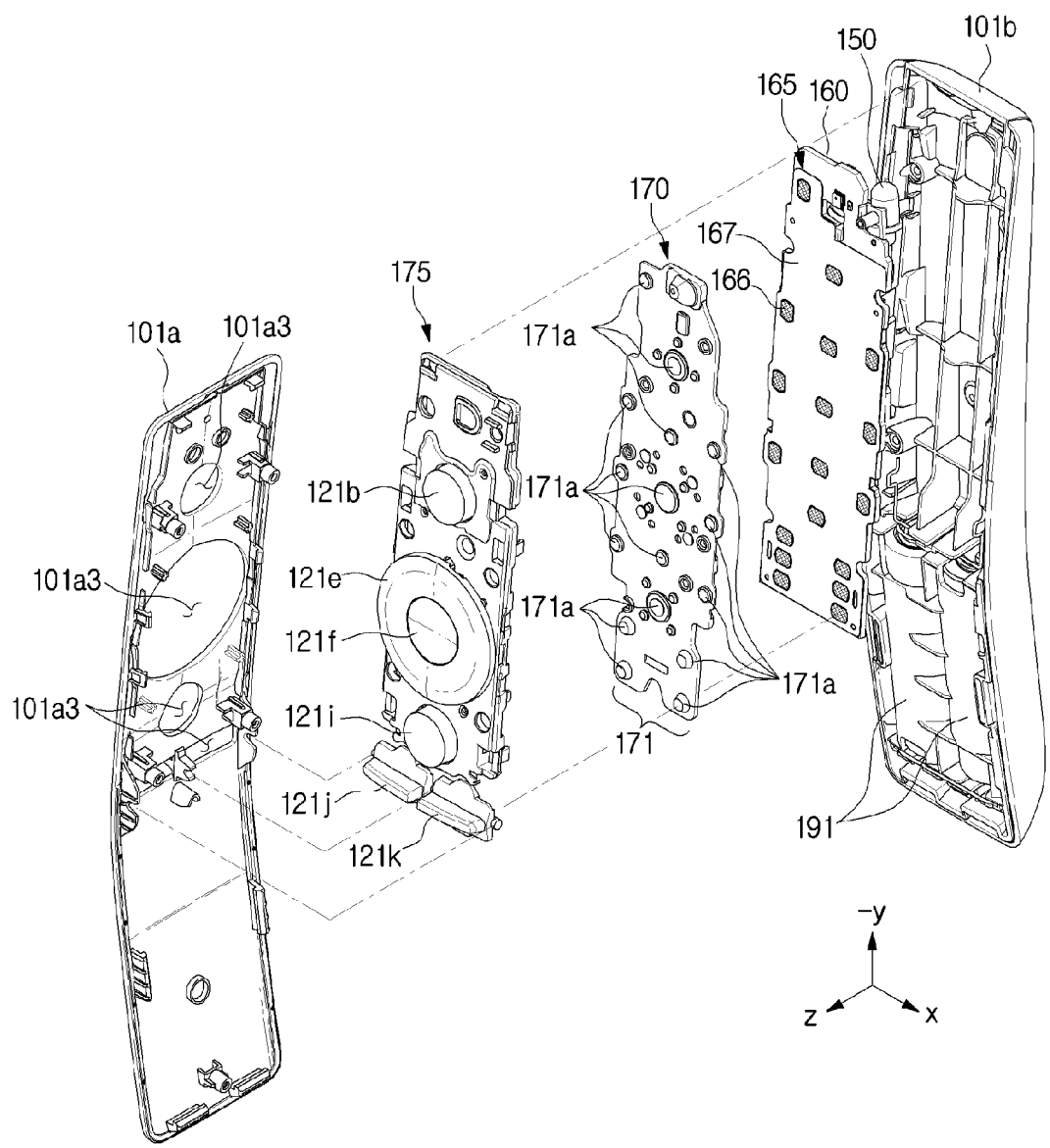
FIG. 3 is a schematic exploded perspective view of the remote controller of the embodiment of the present disclosure.

FIG. 3 is a schematic exploded perspective view of the remote controller of the embodiment of the present disclosure.

Figure 4:
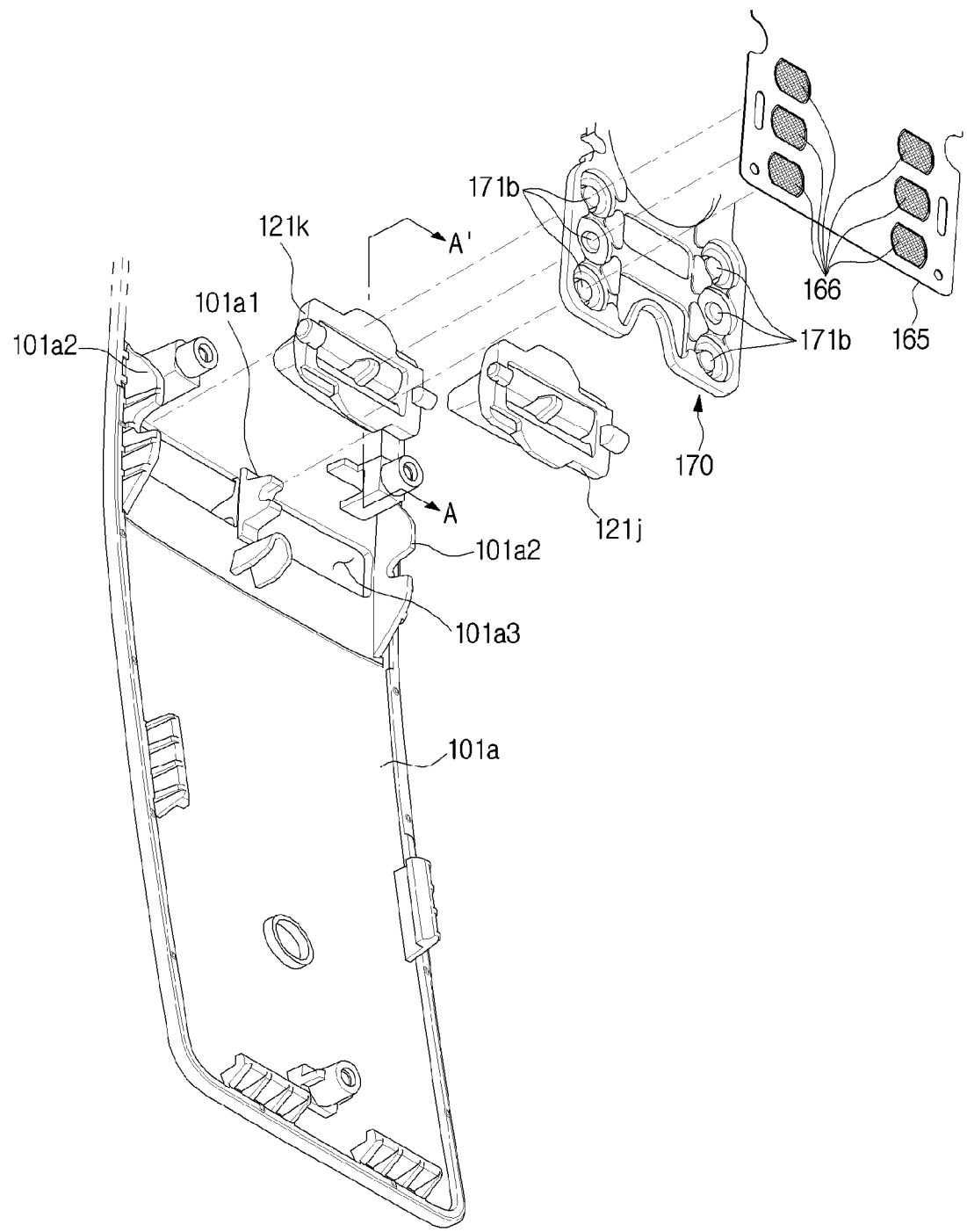
FIG. 4 is a schematic exploded perspective view of the tilt switch of the remote controller of the embodiment of the present disclosure.

FIG. 4 is a schematic exploded perspective view of the tilt switch of the remote controller of the embodiment of the present disclosure.

Referring to FIGS. 3 and 4, the remote controller 100 may include the housing 101, a printed circuit board 160, a dome assembly 165, a rubber 170, or a button assembly 175. The remote controller 100 may include the printed circuit board 160 and the battery 191 for supplying the power to electronic components mounted on the printed circuit board 160. Also, the remote controller 100 may further include a sensor (not shown) or the vibration sensor (not shown).

The housing 101 may accommodate the elements (e.g., 121 to 191) of the remote controller 100 (e.g., some of the elements such as a button 121$b$ may be exposed to an outside of the housing 101). The housing 101 may be configured with the first housing 101$a$ and the second housing 101$b$. Also, the housing 101 may be configured with not only the plurality of housings 101$a$ and 101$b$ but also additional (e.g., three or more) housings (not shown).

The processor (or referred to as the controller) (not shown) for controlling the operation and the internal elements 121 to 191 of the remote controller 100, a contact 161 (referring to FIG. 5) corresponding to the button 121 and the infrared diode 150 for outputting infrared light may be mounted on the printed circuit board 160. The local area communication part (not shown) including the Bluetooth communication part (not shown), or the microphone (not shown) may be mounted on the printed circuit board 160. Also, the sensor (not shown) or the vibration motor (not shown) may be mounted on the printed circuit board 160.

The processor (not shown) may include the ROMs (not shown) as the non-volatile memories or the RAMs (not shown) as the volatile memories which are mutually connected by a bus.

The contact 161 having one of a circular shape and an elliptical shape may be formed at the printed circuit board 160 under the button 121 to correspond to the number of buttons 121. The contact 161 may be configured with a first contact 161$a$1, 161$a$2, 161$a$3 and a second contact 161$b$. When the first contact 161$a$1, 161$a$2, 161$a$3 and the second contact 161$b$ are connected by the pressing of the button 121, the processor (not shown) may detect (or recognize) the pressing of the button 121.

The infrared diode 150 may be mounted on an upper end of the printed circuit board 160 (e.g., in a −y axial direction).

The infrared diode 150 may include a plurality of infrared diodes 150 having different light emitting directions. The infrared diode 150 may output a light signal corresponding to the pressing of the button to the display device 200 or an external device (e.g., the set-top box or the like) by controlling of the processor (not shown).

The local area communication part (not shown) may transmit the control information (e.g., the turning-on/off of the power, the changing of the channel/volume, executing of an application or the like) corresponding to the user's input (e.g., the touching, the pressing, the touch gesture, the voice or the motion) to the display device 200 as the control target by the controlling of the processor (not shown). The local area communication part (not shown) may be wirelessly connected to the display device 200 by the controlling of the processor (not shown). The local area communication part (not shown) may include the wireless LAN communication part (not shown). Also, the local area communication may include, for example, Bluetooth, Bluetooth low energy, infrared data association (IrDA), ultra-wideband (UWB), near field communication (NFC) or the like.

The sensor (not shown) may be mounted on the printed circuit board 160. The sensor (not shown) may include the motion sensor (not shown) for detecting the motion of the remote controller 100, the gyro sensor (not shown) for detecting the direction using the rotational inertia of the remote controller 100, or the acceleration sensor (not shown) for detecting the acceleration of each of the three axes (e.g., the x axis, they axis and the z axis) applied to the remote controller 100.

The vibration motor (not shown) may be mounted on the printed circuit board 160. The vibration motor (not shown) may convert the electric signal into the mechanical vibration according to the controlling of the processor (not shown). For example, the vibration motor (not shown) may include the linear vibration motor, the bar type vibration motor, the coin type vibration motor or the piezoelectric element vibration motor. One or a plurality of vibration motors (not shown) may be located inside the remote controller 100. Also, the vibration motor (not shown) may vibrate the entire remote controller 100 or a part of the remote controller 100.

The dome assembly 165 corresponds to the number of contacts 161 and may include a metal dome (or a conductive elastic body 166) having elasticity and a protective film 167. The dome assembly 165 may be located on the upper end of the printed circuit board 160 (e.g., in a z axial direction).

The rubber 170 may include a plurality of protrusions 171 corresponding to the pressing of the button 121. The rubber 170 may be formed of a non-conductor (or a non-conductive elastic body) having elasticity. The rubber 170 may be located at an upper end of the dome assembly 165 (e.g., in the z axial direction) and may be located at a lower end of the button assembly 175 (e.g., in a −z axial direction).

A thickness of the rubber 170 may be greater than that of the dome assembly 165. The thickness of the rubber 170 may be greater than that of the metal dome 166. Also, the thickness of the rubber 170 may be smaller than that of the printed circuit board 160.

The protrusions 171 may have elasticity and may press the metal dome 166 located at the lower end (e.g., in the −z axial direction) to correspond to the pressing of the button 121 (e.g., formed to be opposite to the button). When the pressing of the button 121 is released, the protrusions 171 may be restored by the elasticity.

The protrusions 171 may include a first protrusion 171*a* protruding to a front surface of the first housing 101*a* (e.g., in the z axial direction) and a second protrusion 171*b* (referring to FIG. 4) protruding to a bottom surface of the first housing 101*a* (e.g., in the −z axial direction). A width (referring to FIG. 5) of the first protrusion 171*a* may be larger than that of the second protrusion 171*b*.

The protrusions 171 may include the first protrusion 171*a* formed to correspond to the pressing of the button 121 (e.g., formed at a position opposite to the button) and the second protrusion 171*b* (referring to FIG. 4) protruding from a lower end of the first protrusion 171*a* toward the metal dome 166 (e.g., in a direction opposite to a protruding direction of the first protrusion). Also, the first protrusion 171*a* and the second protrusion 171*b* of the protrusions 171 may be integrally formed.

The button assembly 175 may transmit the pressing of some of the buttons to the rubber 170. For example, the button assembly 175 may transmit the pressing of the buttons (e.g., the remaining buttons except the buttons 121*b*, 121*e* and 121*i*) to the rubber 170.

The button assembly 175 may be located at an upper end of the rubber 170 (e.g., in the z axial direction). The button assembly 175 may have one or a plurality of through-holes, and one or the plurality of buttons 121*b*, 121*e* and 121*i* may be exposed to the outside through the through-holes.

The button assembly 175 may include the tilt switches 121*j* and 121*k*. Also, the tilt switches 121*j* and 121*k* may be separated from the button assembly 175. The tilt switches 121*j* and 121*k* may be in direct contact with the protrusion 171 of the rubber 170 by the user's input (e.g., one of the tilting and the pressing of the switch). Each of the tilt switches 121*j* and 121*k* may have a rotational shaft 121*k*5 extending in one direction (e.g., the x axial direction) and may be inclined clockwise and counterclockwise based on supporters 101*a*1 and 101*a*2 of the first housing 101*a*. The rotational shaft 121*k*5 may extend from the fourth extending portion 121*k*4.

Detailed description of the tilt switch will be provided later (with reference to FIGS. 5 to 8).

The first housing 101*a* may allow the button to be exposed through a through-hole 101*a*3. For example, the buttons 121*b*, 121*e*, 121*f* and 121*i* may be exposed to the outside through the through-hole 101*a*3. Also, the tilt switches 121*j* and 121*k* may be exposed to the outside through the through-hole 101*a*3.

A partial area of the front surface of the first housing 101*a* may be configured with the button for controlling the display device 200. For example, when an area 121*a* corresponding to an icon 121*a*1 illustrated at the front surface of the first housing 101*a* is selected (e.g., pushed or pressed) by the user, it may be detected as a selection of a power button corresponding to the icon 121*a*1 by the processor (not shown). Similarly, when an area 121*g* corresponding to an icon 121*g*1 illustrated at the front surface of the first housing 101*a* is selected, it may be detected as a selection of a return button corresponding to the icon 121*g*1 by the processor (not shown). It may be understood by those skilled in the art that this may be similarly applied to other buttons 121*c*, 121*d* and 121*h*.

Figure 5:
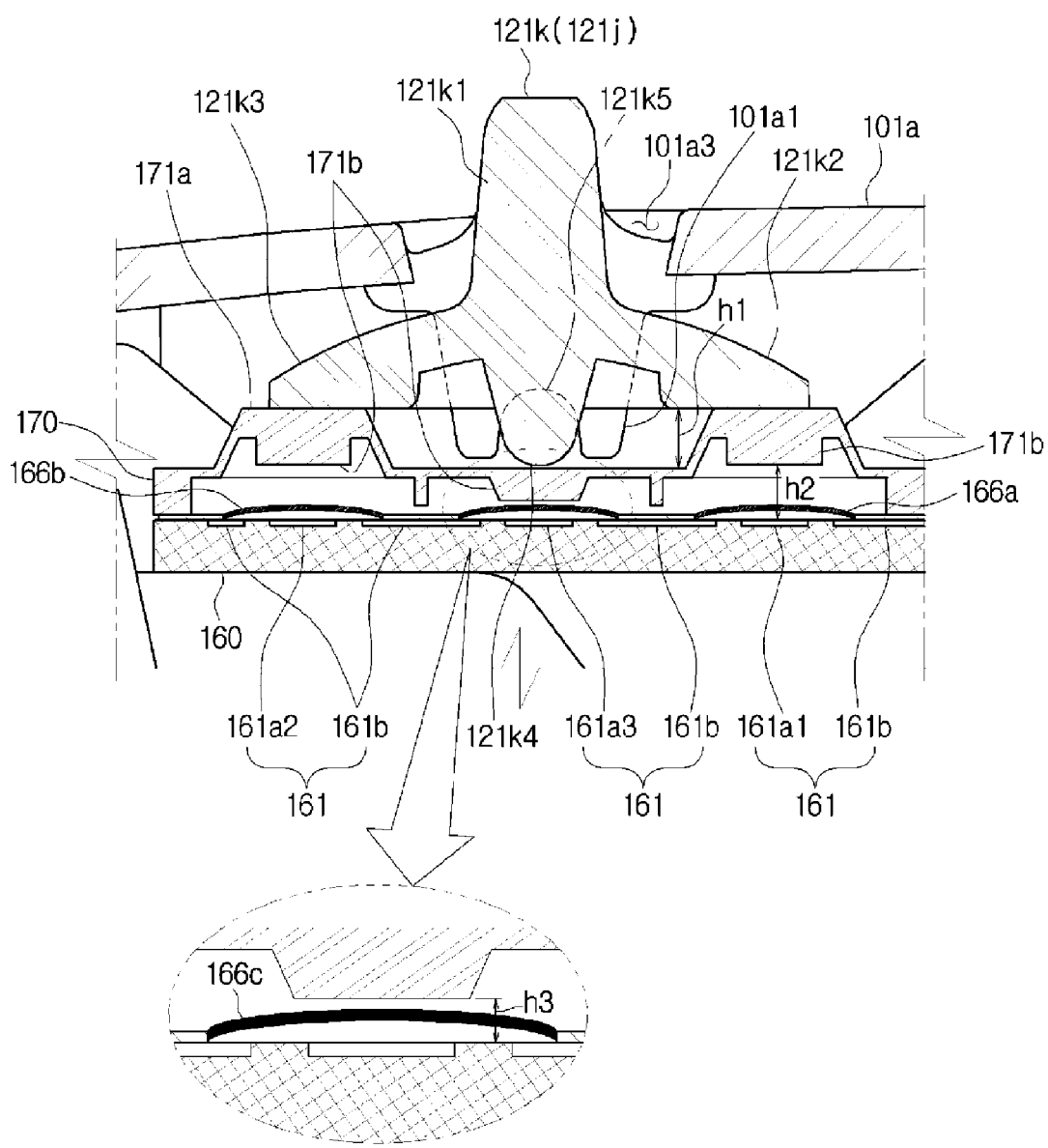
FIG. 5 is a schematic cross-sectional view of the tilt switch of the remote controller according to the embodiment of the present disclosure.

FIG. 5 is a schematic cross-sectional view of the tilt switch of the remote controller according to the embodiment of the present disclosure. FIG. 5 is a cross-sectional view taken along line A-A' in the tilt switch of FIG. 4.

Referring to FIG. 5, the tilt switch 121*k* may include a first extending portion 121*k*1 (or a main extending portion) extending in a first direction (e.g., the z axial direction) based on a center of the tilt switch 121*k* to be in contact with the user (or to receive the user's input), the second extending portion 121*k*2 (or a first sub-extending portion) and the third extending portion 121k3 (or a second sub-extending portion) protruding in a direction different from that of the first extending portion 121k1 and corresponding to a change in the channel, and the fourth extending portion 121k4 (or a third sub-extending portion) protruding in a direction opposite to that of the first extending portion 121k1 (e.g., in the −z axial direction) and corresponding to performing of a different function from the function of changing the channel. The direction opposite to that of the first extending portion 121k1 may be 160° or more and 210° or less in the clockwise direction based on the first extending portion 121k1.

The tilt switch 121k may be inclined at an angle (e.g., 14° which may be varied according to manufacturers) set based on the supporters 101a1 and 101a2 using the rotational shaft 121k5. The set angle may be 5° or more and 30° or less.

The set angle may be changed to correspond to a width of the through-hole 101a3 of the first housing 101a through which the first extending portion 121k1 of the tilt switch 121k is exposed to the outside. For example, when the width of the through-hole 101a3 of the first housing 101a is increased, a tiltable angle of the tilt switch 121k may also be increased. Also, the tilt switch 121k may be inclined so that the through-hole 101a3 of the first housing 101a and the first extending portion 121k1 of the tilt switch 121k are not in contact with each other.

The set angle may be changed to correspond to a height h1 of the first protrusion 171a of the rubber 170 which is in contact with the second extending portion 121k2 of the tilt switch 121k. For example, when the height h1 of the first protrusion 171a of the rubber 170 which is in contact with the second extending portion 121k2 is increased, the tiltable angle of the tilt switch 121k may be increased.

Also, the set angle may be changed to correspond to a gap h2 between the contact 161a1 and a surface of the second protrusion 171b of the rubber 170 which is in contact with the second extending portion 121k2 of the tilt switch 121k. For example, when the gap h2 between the contact 161a1 and the surface of the second protrusion 171b of the rubber 170 which is in contact with the second extending portion 121k2 is increased, the tiltable angle of the tilt switch 121k may also be increased.

When the second extending portion 121k2 of the tilt switch 121k corresponds to the channel-up, the third extending portion 121k3 may correspond to the channel-down. The fourth extending portion 121k4 of the tilt switch 121k may correspond to displaying of the additional information (e.g., the EPG). Also, other functions (e.g., picture in picture (PIP)) rather than the displaying of the additional information may be set to the fourth extending portion 121k4 of the tilt switch 121k.

In the tilt switch, unlike the first protrusion 171a of the rubber 170 corresponding to the second extending portion 121k2 and the third extending portion 121k3, the first protrusion may not be located at a surface of the rubber 170 corresponding to the fourth extending portion 121k4. Alternatively, at the surface of the rubber 170 corresponding to the fourth extending portion 121k4, a height of the first protrusion 171a may be formed lower than that of the first protrusion 171a of the rubber 170 corresponding to the second extending portion 121k2 and the third extending portion 121k3.

In the tilt switch 121k, a gap h3 between a surface of the second protrusion 171b corresponding to the fourth extending portion 121k4 and the contact 161a3 may be smaller than the gap h2 between the contact 161a1 and the surface of the second protrusion 171b of the rubber 170 which is in contact with the second extending portion 121k2.

A shape of the first protrusion 171a of the rubber 170 corresponding to the extending portions 121k2 to 121k4 of the tilt switch 121k may be varied.

The tilt switch 121k may be inclined to correspond to a difference of a height h1 between the first protrusion 171a corresponding to the second extending portion 121k2 and the surface of the rubber 170 corresponding to the fourth extending portion 121k4. Also, the tilt switch 121k may be inclined to correspond to a difference of the height h1 between the first protrusion 171a corresponding to the third extending portion 121k3 and the surface of the rubber 170 corresponding to the fourth extending portion 121k4.

A shape of the second protrusion 171b of the rubber 170 corresponding to the extending portions 121k2 to 121k4 of the tilt switch 121k may be varied.

When the tilt switch 121k is moved (e.g., in the z axial direction) by the gap h3 between the surface of the second protrusion 171b of the rubber 170 corresponding to the fourth extending portion 121k4 and the contact 161a3, one surface of the metal dome 166 may be in contact with the surface of the second protrusion 171b, and the other surface of the metal dome 166 may be in contact with the contact 161a3. Also, when the tilt switch 121k is moved (e.g., in the −z axial direction) by the gap h3 between the surface of the second protrusion 171b of the rubber 170 corresponding to the fourth extending portion 121k4 and the contact 161a3, the second protrusion 171b corresponding to the second extending portion 121k2 and the second protrusion 171b corresponding to the third extending portion 121k3 are not in contact with the metal dome 166.

Similarly, when the tilt switch 121k is moved (e.g., in the −z axial direction) by the gap h3 between the surface of the second protrusion 171b of the rubber 170 corresponding to the fourth extending portion 121k4 and the contact 161a3 and the second protrusion 171b corresponding to the second extending portion 121k2 and the second protrusion 171b corresponding to the third extending portion 121k3 are in contact with one surface of the metal domes 166 respectively, the other surfaces of the metal domes 166 may not be in contact with the contacts 161a1 and 161a2.

FIGS. 6A-6C are schematic views illustrating a first motion of the tilt switch of the remote controller according to the embodiment of the present disclosure.

Referring to FIGS. 6A-6C, a first operation of the tilt switch 121k may be the channel-up. Also, the first operation of the tilt switch 121j may be a volume-up. For explanation, the first operation will be described using the tilt switch 121k.

Referring to FIG. 6A, the tilt switch 121k is in a stable state which is not moved.

The second extending portion 121k2 of the tilt switch 121k may be in contact with the first protrusion 171a of the rubber 170. In another embodiment of the present disclosure, the second extending portion 121k2 of the tilt switch 121k may not be in contact with the first protrusion 171a of the rubber 170 but may be spaced apart therefrom at a set distance (e.g., more than 0.1 mm and less than h1).

The second protrusion 171b of the rubber 170 corresponding to the second extending portion 121k2 of the tilt switch 121k is spaced apart from one surface of a metal dome 166a. Also, the other surface of the metal dome 166a is spaced apart from a contact 161a1.

Like the second extending portion 121k2 of the tilt switch 121k, the third extending portion 121k3 of the tilt switch 121k may be in contact with the first protrusion 171a. In another embodiment of the present disclosure, the third extending portion 121k3 of the tilt switch 121k may not be in contact with the first protrusion 171*a* of the rubber 170 but it may be spaced apart therefrom at the set distance (e.g., more than 0.1 mm and less than h1).

The second protrusion 171*b* of the rubber 170 corresponding to the third extending portion 121*k*3 of the tilt switch 121*k* is spaced apart from one surface of a metal dome 166*b*. Also, the other surface of the metal dome 166*b* is spaced apart from a contact 161*a*2.

The fourth extending portion 121*k*4 of the tilt switch 121*k* is spaced apart from the surface of the rubber 170. In another embodiment of the present disclosure, the fourth extending portion 121*k*4 of the tilt switch 121*k* may be in contact with a 1-1th protrusion (not shown) having a height lower than the surface of the rubber 170 (or the height h1 of the first protrusion 171*a*).

The second protrusion 171*b* of the rubber 170 corresponding to the fourth extending portion 121*k*4 of the tilt switch 121*k* is spaced part from one surface of a metal dome 166*c*. Also, the other surface of the metal dome 166*c* is spaced apart from a contact 161*a*3.

Referring to FIG. 6B, the tilt switch 121*k* is in a moving state in a first direction (e.g., the clockwise direction). For example, the tilt switch 121*k* is inclined in the first direction (e.g., the clockwise direction).

A user's body or an object is in contact with the first extending portion 121*k*1 of the tilt switch 121*k*. When an external force F is continuously applied to the first extending portion 121*k*1 of the tilt switch 121*k*, the tilt switch 121*k* may be further inclined in the first direction.

When the tilt switch 121*k* is continuously inclined in the first direction, the second extending portion 121*k*2 of the tilt switch 121*k* and the first protrusion 171*a* of the rubber 170 may be in contact with each other.

When the tilt switch 121*k* is continuously inclined in the first direction, the second extending portion 121*k*2 of the tilt switch 121*k* may press the first protrusion 171*a* of the rubber 170. Since the second extending portion 121*k*2 presses other element (e.g., the rubber 170) therearound by the tilting of the tilt switch 121*k*, the second extending portion 121*k*2 may be referred to as a 'pressing portion (or first pressing portion)'.

At the second extending portion 121*k*2 of the tilt switch 121*k* and the first protrusion 171*a* of the rubber 170 which are in contact with each other, a gap between the second protrusion 171*b* of the rubber 170 and one surface of the metal dome 166*a* may become narrower by the external force F provided at the second extending portion 121*k*2 of the tilt switch 121*k* (e.g., h2→h21, the height of h2>the height of h21).

The second protrusion 171*b* of the rubber 170 corresponding to the second extending portion 121*k*2 of the tilt switch 121*k* is still spaced apart from the one surface of the metal dome 166*a*. Also, the other surface of the metal dome 166*a* is spaced apart from the contact 161*a*1.

The third extending portion 121*k*3 of the tilt switch 121*k* may be spaced apart from the first protrusion 171*a* corresponding to the third extending portion 121*k*3.

The second protrusion 171*b* of the rubber 170 corresponding to the third extending portion 121*k*3 of the tilt switch 121*k* is spaced apart from one surface of the metal dome 166*b*. Also, the other surface of the metal dome 166*b* is spaced apart from the contact 161*a*2.

The fourth extending portion 121*k*4 of the tilt switch 121*k* is spaced part from the surface of the rubber 170. In another embodiment of the present disclosure, the fourth extending portion 121*k*4 of the tilt switch 121*k* may be in contact with the 1-1th protrusion (not shown) having the height lower than the surface of the rubber 170 (or the height h1 of the first protrusion 171*a*).

The second protrusion 171*b* of the rubber 170 corresponding to the fourth extending portion 121*k*4 of the tilt switch 121*k* is spaced part from one surface of the metal dome 166*c*. Also, the other surface of the metal dome 166*c* is spaced apart from the contact 161*a*3.

Referring to FIG. 6C, the tilt switch 121*k* is in a continuously moving state in the first direction (e.g., the clockwise direction).

When the external force is continuously applied to the first extending portion 121*k*1 of the tilt switch 121*k*, the tilt switch 121*k* may be continuously inclined in the first direction.

When the tilt switch 121*k* is continuously inclined in the first direction, at the second extending portion 121*k*2 of the tilt switch 121*k* and the first protrusion 171*a* of the rubber 170 which are in contact with each other, the gap between the second protrusion 171*b* of the rubber 170 and the one surface of the metal dome 166*a* may be 0 by the external force transmitted from the second extending portion 121*k*2 of the tilt switch 121*k*.

The second protrusion 171*b* of the rubber 170 corresponding to the second extending portion 121*k*2 of the tilt switch 121*k* may be in contact with the one surface of the metal dome 166*a*.

When the tilt switch 121*k* is continuously inclined in the first direction, the other surface of the metal dome 166*a* of which the one surface is in contact with the second protrusion 171*b* of the rubber 170 corresponding to the second extending portion 121*k*2 of the tilt switch 121*k* may also be in contact with the contact 161*a*1.

When the other surface of the metal dome 166*a* is in contact with the contact 161*a*1, the processor (not shown) may detect a signal corresponding to the channel-up of the display device 200.

The processor (not shown) may output a control signal corresponding to the channel-up of the display device 200 using at least one of the infrared diode 150 and the local area communication part (not shown).

The display device 200 may receive the control signal transmitted from the remote controller 100 using at least one of the light receiving part (not shown) and the local area communication part (not shown). The controller (not shown) of the display device 200 may control the channel displayed on the screen to be changed into another channel (e.g., the channel 606 changed from the channel 605) in response to the received control signal and then to display the changed channel.

When a contact time between the other surface of the metal dome 166*a* and the contact 161*a*1 is increased, the processor (not shown) may continuously detect the signal corresponding to the channel-up of the display device 200.

The processor (not shown) may continuously output the control signal corresponding to the channel-up of the display device 200 in response to an increase in the contact time between the other surface of the metal dome 166*a* and the contact 161*a*1 using at least one of the infrared diode 150 and the local area communication part (not shown).

The display device 200 may continuously receive the control signal transmitted from the remote controller 100 using at least one of the light receiving part (not shown) and the local area communication part (not shown). The controller (not shown) of the display device 200 may control the channel displayed on the screen to be changed into another channel (e.g., the channel 607, 608, 609, . . . changed from the channel 606) in response to the received control signal and then to display the changed channel.

The third extending portion 121k3 of the tilt switch 121k may be maximally spaced apart from the first protrusion 171a corresponding to the third extending portion 121k3.

The second protrusion 171b of the rubber 170 corresponding to the third extending portion 121k3 of the tilt switch 121k is in a spaced state from the one surface of the metal dome 166b. Also, the other surface of the metal dome 166b is in the spaced state from the contact 161a2.

The fourth extending portion 121k4 of the tilt switch 121k is spaced apart from the surface of the rubber 170.

The second protrusion 171b of the rubber 170 corresponding to the fourth extending portion 121k4 of the tilt switch 121k is in the spaced state from the one surface of the metal dome 166c. Also, the other surface of the metal dome 166c is in the spaced state from the contact 161a3.

When the channel corresponding to a channel number selected by the user is displayed on the display device 200, the user may remove the external force applied to the first extending portion 121k1 of the tilt switch 121k.

When the external force applied to the first extending portion 121k1 of the tilt switch 121k is removed, the tilt switch 121k may be restored from a state of FIG. 6C into a state of FIG. 6A by the elasticity of at least one of the rubber 170 and the metal dome 166a corresponding to the second extending portion 121k2 of the tilt switch 121k.

Figure 7A:
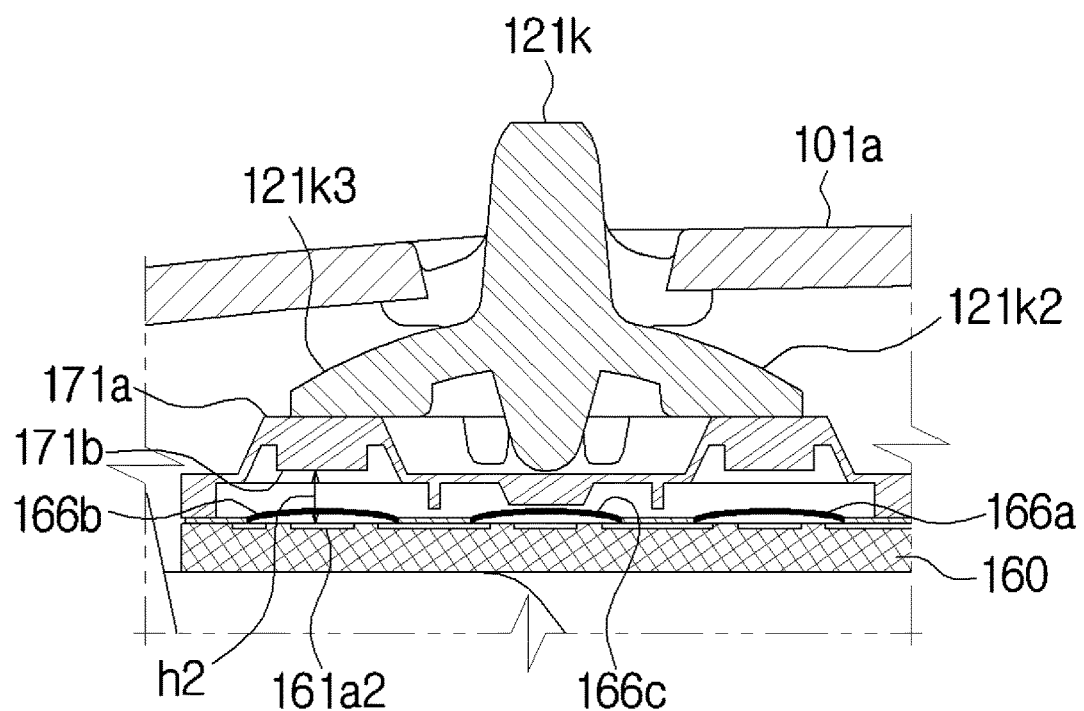
FIGS. 7A-7C are schematic views illustrating a second operation of the tilt switch of the remote controller according to the embodiment of the present disclosure.
Figure 7B:
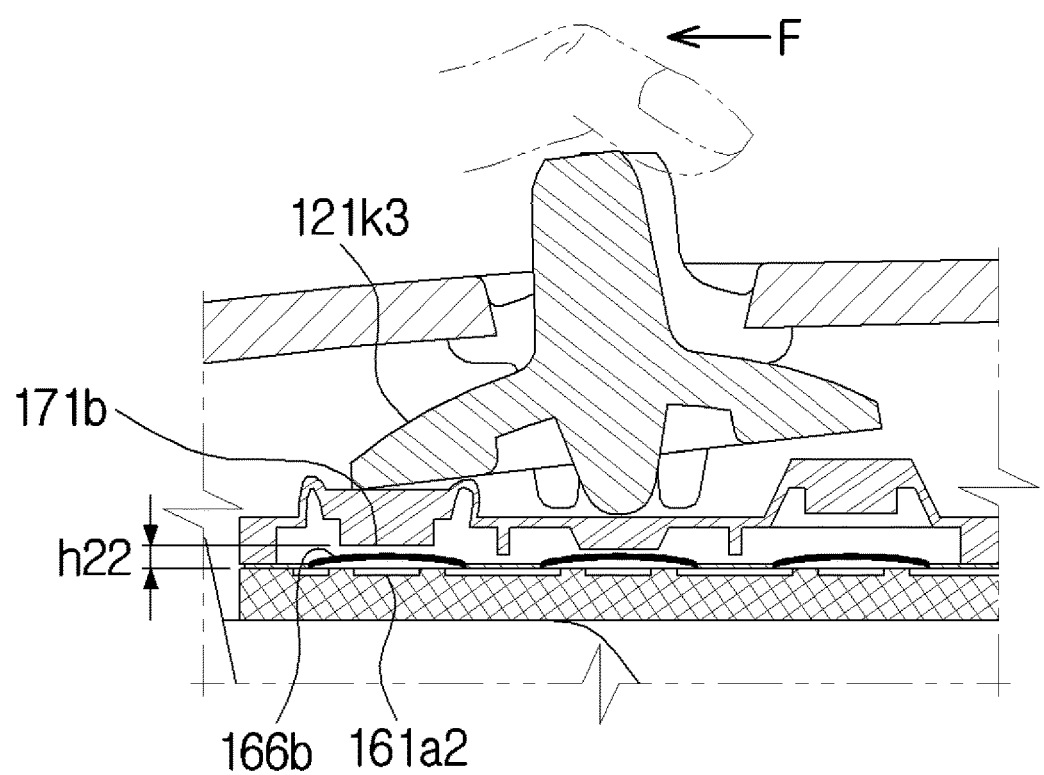
Figure 7C:
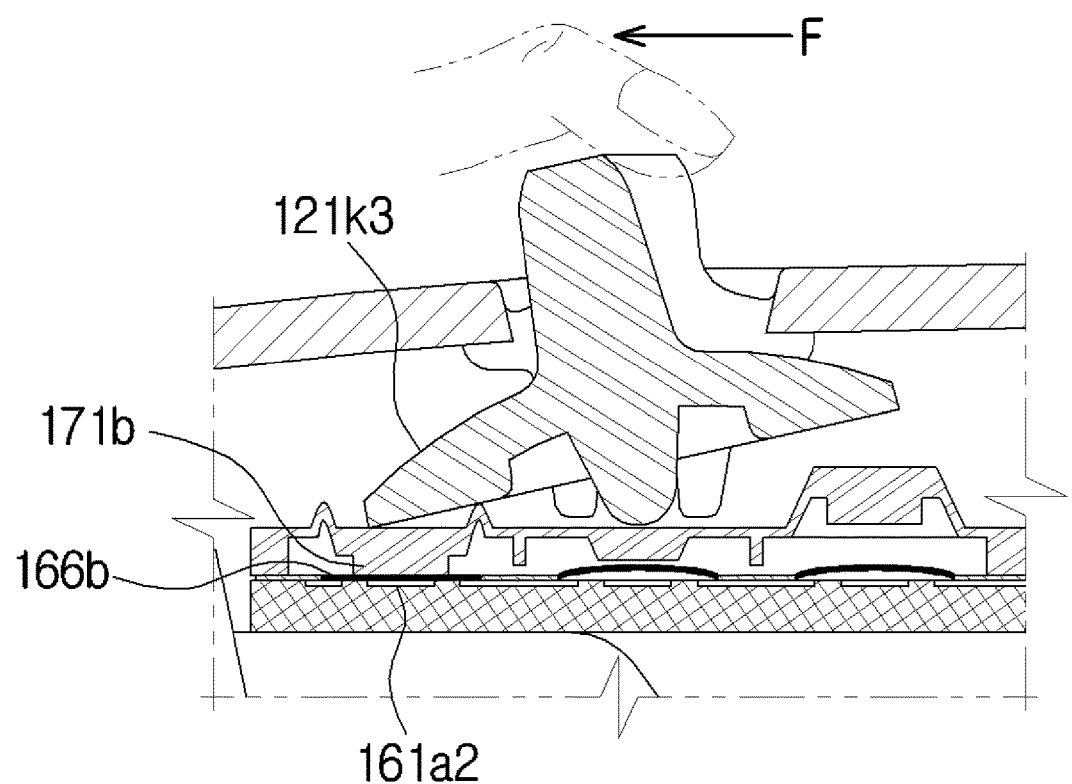

FIGS. 7A-7C are schematic views illustrating a second operation of the tilt switch of the remote controller according to the embodiment of the present disclosure.

Referring to FIGS. 7A-7C, a second operation of the tilt switch 121k may be a channel-down. Also, the second operation of the tilt switch 121j may be a volume-down. For explanation, the second operation will be described using the tilt switch 121k.

Referring to FIG. 7A, the tilt switch 121k is in a stable state which is not moved.

The state of the tilt switch 121k in FIG. 7A is substantially similar to the state of the tilt switch 121k in FIG. 6A (e.g., there may be a difference in the motion), and thus repeated description thereof will be omitted.

Referring to FIG. 7B, the tilt switch 121k is in a moving state in another direction (e.g., the counterclockwise direction). For example, the tilt switch 121k is inclined in another direction (or a second direction (e.g., the counterclockwise direction)).

A user's body or an object is in contact with the first extending portion 121k1 of the tilt switch 121k. When the external force F is applied to the first extending portion 121k1 of the tilt switch 121k, the tilt switch 121k may be inclined in the second direction.

When the tilt switch 121k is continuously inclined in the second direction, the third extending portion 121k3 of the tilt switch 121k and the first protrusion 171a of the rubber 170 may be in contact with each other.

When the tilt switch 121k is continuously inclined in the second direction, the third extending portion 121k3 of the tilt switch 121k may press the first protrusion 171a of the rubber 170. Since the third extending portion 121k3 presses other element (e.g., the rubber 170) therearound by the tilting of the tilt switch 121k, the third extending portion 121k3 may be referred to as a 'pressing portion (or second pressing portion)'.

At the third extending portion 121k3 of the tilt switch 121k and the first protrusion 171a of the rubber 170 which are in contact with each other, a gap between the second protrusion 171b of the rubber 170 and the one surface of the metal dome 166b may become narrower by the external force F provided at the third extending portion 121k3 of the tilt switch 121k (e.g., h2→h22, the height of h2>the height of h22).

The second protrusion 171b of the rubber 170 corresponding to the third extending portion 121k3 of the tilt switch 121k is still spaced apart from the one surface of the metal dome 166b. Also, the other surface of the metal dome 166b is spaced apart from the contact 161a2.

The second extending portion 121k2 of the tilt switch 121k may be spaced apart from the first protrusion 171a corresponding to the second extending portion 121k2.

The second protrusion 171b of the rubber 170 corresponding to the second extending portion 121k2 of the tilt switch 121k is spaced apart from the one surface of the metal dome 166a. Also, the other surface of the metal dome 166a is spaced apart from the contact 161a1.

The fourth extending portion 121k4 of the tilt switch 121k is spaced part from the surface of the rubber 170. The state of the fourth extending portion 121k4 of the tilt switch 121k in FIG. 7B is substantially similar to the state of the fourth extending portion 121k4 of the tilt switch 121k in FIG. 6B (e.g., there may be a difference in the motion), and thus repeated description thereof will be omitted.

Referring to FIG. 7C, the tilt switch 121k is in a continuously moving state in the second direction (e.g., the counterclockwise direction).

When the external force is continuously applied to the first extending portion 121k1 of the tilt switch 121k, the tilt switch 121k may be continuously inclined in the second direction.

When the tilt switch 121k is continuously inclined in the second direction, at the third extending portion 121k3 of the tilt switch 121k and the first protrusion 171a of the rubber 170 which are in contact with each other, the gap between the second protrusion 171b of the rubber 170 and the one surface of the metal dome 166b may be 0 by the external force transmitted from the third extending portion 121k3 of the tilt switch 121k.

The second protrusion 171b of the rubber 170 corresponding to the third extending portion 121k3 of the tilt switch 121k may be in contact with the one surface of the metal dome 166b.

When the tilt switch 121k is continuously inclined in the second direction, the other surface of the metal dome 166b of which the one surface is in contact with the second protrusion 171b of the rubber 170 corresponding to the third extending portion 121k3 of the tilt switch 121k may also be in contact with the contact 161a2.

When the other surface of the metal dome 166b is in contact with the contact 161a2, the processor (not shown) may detect a signal corresponding to the channel-down of the display device 200.

The processor (not shown) may output a control signal corresponding to the channel-down of the display device 200 using at least one of the infrared diode 150 and the local area communication part (not shown).

The display device 200 may receive the control signal transmitted from the remote controller 100 using at least one of the light receiving part (not shown) and the local area communication part (not shown). The controller (not shown) of the display device 200 may control the channel displayed on the screen to be changed into another channel (e.g., the channel 604 changed from the channel 605) in response to the received control signal and then to display the changed channel.

When a contact time between the other surface of the metal dome 166*b* and the contact 161*a*2 is increased, the processor (not shown) may continuously detect the signal corresponding to the channel-down of the display device 200.

The processor (not shown) may continuously output the control signal corresponding to the channel-down of the display device 200 in response to an increase in the contact time between the other surface of the metal dome 166*b* and the contact 161*a*2 using at least one of the infrared diode 150 and the local area communication part (not shown).

The display device 200 may continuously receive the control signal transmitted from the remote controller 100 using at least one of the light receiving part (not shown) and the local area communication part (not shown). The controller (not shown) of the display device 200 may control the channel displayed on the screen to be changed into another channel (e.g., the channel 603, 602, 601, . . . changed from the channel 604) in response to the received control signal and then to display the changed channel.

The second extending portion 121*k*2 of the tilt switch 121*k* may be maximally spaced apart from the first protrusion 171*a* corresponding to the second extending portion 121*k*2.

The second protrusion 171*b* of the rubber 170 corresponding to the second extending portion 121*k*2 of the tilt switch 121*k* is in a spaced state from the one surface of the metal dome 166*a*. Also, the other surface of the metal dome 166*a* is in the spaced state from the contact 161*a*1.

The fourth extending portion 121*k*4 of the tilt switch 121*k* is spaced apart from the surface of the rubber 170. The state of the fourth extending portion 121*k*4 of the tilt switch 121*k* in FIG. 7C is substantially similar to the state of the fourth extending portion 121*k*4 of the tilt switch 121*k* in FIG. 6C (e.g., there may be a difference in the motion), and thus repeated description thereof will be omitted.

When the external force applied to the first extending portion 121*k*1 of the tilt switch 121*k* is removed, the tilt switch 121*k* may be restored from a state of FIG. 7C into a state of FIG. 7A by the elasticity of at least one of the rubber 170 and the metal dome 166*b* corresponding to the third extending portion 121*k*3 of the tilt switch 121*k*.

Figure 8A:
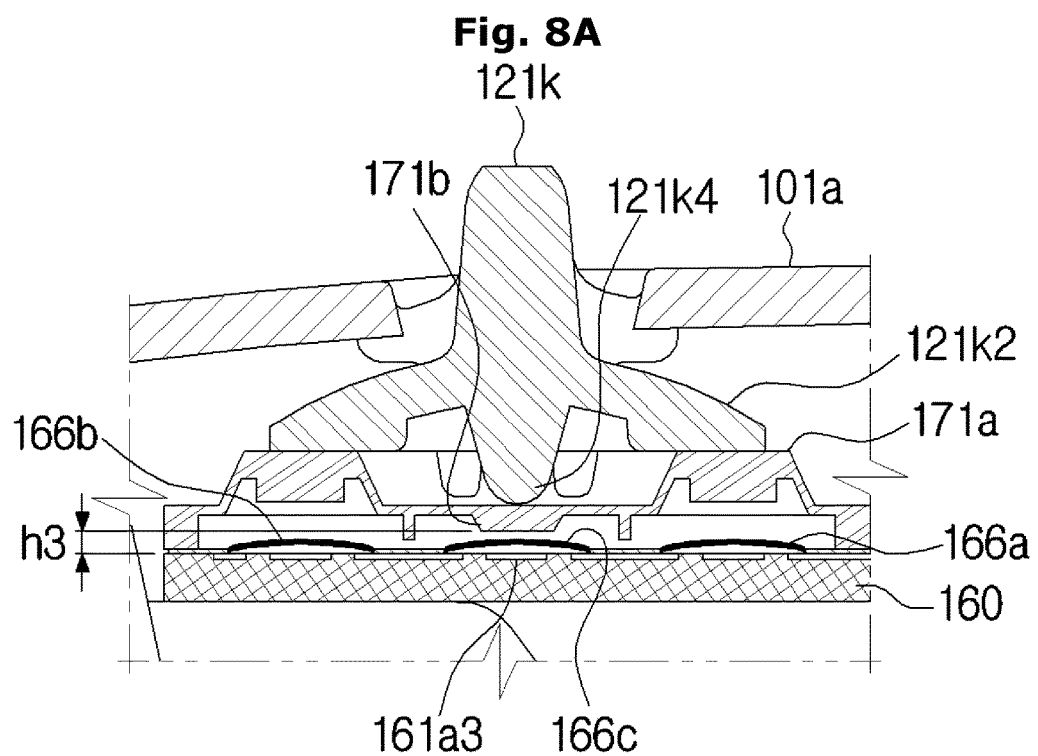

FIGS. 8A-8C are schematic views illustrating a third operation of the tilt switch of the remote controller according to the embodiment of the present disclosure.

Referring to FIGS. 8A-8C, a third operation of the tilt switch 121*k* may be the displaying of the additional information. Also, the third operation of the tilt switch 121*j* may be the muting of the volume. For explanation, the third operation will be described using the tilt switch 121*k*.

Referring to FIG. 8A, the tilt switch 121*k* is in a stable state which is not moved.

The state of the tilt switch 121*k* in FIG. 8A is substantially similar to the state of the tilt switch 121*k* in FIG. 6A (e.g., there may be a difference in the motion), and thus repeated description thereof will be omitted.

Referring to FIG. 8B, the tilt switch 121*k* is in a moving state in a third direction (e.g., the −z axial direction). For example, the tilt switch 121*k* is linearly moved in the third direction (e.g., the −z axial direction).

A user's body or an object is in contact with the first extending portion 121*k*1 of the tilt switch 121*k* in the third direction. When the external force F is applied to the first extending portion 121*k*1 of the tilt switch 121*k*, the tilt switch 121*k* may be moved in the third direction.

At the fourth extending portion 121*k*4 of the tilt switch 121*k* and the surface of the rubber 170 which are in contact with each other, a gap between the second protrusion 171*b* of the rubber 170 and the one surface of the metal dome 166*c* may become narrower by the external force F provided at the fourth extending portion 121*k*4 of the tilt switch 121*k* (e.g., h3→h31, the height of h3>the height of h31). Since the fourth extending portion 121*k*4 presses other element (e.g., the rubber 170) therearound by the movement of the tilt switch 121*k* (e.g., in the −z axial direction), the fourth extending portion 121*k*4 may be referred to as a 'pressing portion (or third pressing portion)'.

The second protrusion 171*b* of the rubber 170 corresponding to the fourth extending portion 121*k*4 of the tilt switch 121*k* is still spaced apart from the one surface of the metal dome 166*c*. Also, the other surface of the metal dome 166*c* is spaced apart from the contact 161*a*3.

The second extending portion 121*k*2 of the tilt switch 121*k* may be spaced apart from the first protrusion 171*a* corresponding to the second extending portion 121*k*2. A spaced distance between the second extending portion 121*k*2 of the tilt switch 121*k* and the first protrusion 171*a* corresponding to the second extending portion 121*k*2 in FIG. 8B may be shorter than the spaced distance between the second extending portion 121*k*2 of the tilt switch 121*k* and the first protrusion 171*a* corresponding to the second extending portion 121*k*2 in FIG. 8A.

The second protrusion 171*b* of the rubber 170 corresponding to the second extending portion 121*k*2 of the tilt switch 121*k* is spaced apart from the one surface of the metal dome 166*a*. Also, the other surface of the metal dome 166*a* is spaced apart from the contact 161*a*1.

The third extending portion 121*k*3 of the tilt switch 121*k* may be spaced apart from the first protrusion 171*a* corresponding to the third extending portion 121*k*3. The spaced distance between the third extending portion 121*k*3 of the tilt switch 121*k* and the first protrusion 171*a* corresponding to the third extending portion 121*k*3 in FIG. 8B may be shorter than the spaced distance between the third extending portion 121*k*3 of the tilt switch 121*k* and the first protrusion 171*a* corresponding to the third extending portion 121*k*3 in FIG. 8A.

The second protrusion 171*b* of the rubber 170 corresponding to the third extending portion 121*k*3 of the tilt switch 121*k* is in a spaced state from the one surface of the metal dome 166*b*. Also, the other surface of the metal dome 166*b* is in the spaced state from the contact 161*a*2.

Referring to FIG. 8C, the tilt switch 121*k* is in a continuously moving state in the third direction (e.g., the −z axial direction).

When the external force in the third direction is continuously applied to the first extending portion 121*k*1 of the tilt switch 121*k*, the tilt switch 121*k* may be continuously moved in the third direction.

When the tilt switch 121*k* is continuously moved in the third direction, at the fourth extending portion 121*k*4 of the tilt switch 121*k* and the surface of the rubber 170 which are in contact with each other, the gap between the second protrusion 171*b* of the rubber 170 and the one surface of the metal dome 166*c* may be 0 by the external force transmitted from the fourth extending portion 121*k*4 of the tilt switch 121*k*.

The second protrusion 171*b* of the rubber 170 corresponding to the fourth extending portion 121*k*4 of the tilt switch 121*k* may be in contact with the one surface of the metal dome 166*c*.

When the tilt switch 121*k* is continuously moved in the third direction, the other surface of the metal dome 166*c* of which the one surface is in contact with the second protrusion 171*b* of the rubber 170 corresponding to the fourth extending portion 121*k*4 of the tilt switch 121*k* may also be in contact with the contact 161*a*3.

When the other surface of the metal dome 166*c* is in contact with the contact 161*a*3, the processor (not shown) may detect a signal corresponding to the displaying of the additional information of the display device 200.

The processor (not shown) may output a control signal corresponding to the displaying of the additional information of the display device 200 using at least one of the infrared diode 150 and the local area communication part (not shown).

The display device 200 may receive the control signal transmitted from the remote controller 100 using at least one of the light receiving part (not shown) and the local area communication part (not shown). The controller (not shown) of the display device 200 may control the screen to display the additional information in response to the received control signal.

When a contact time between the other surface of the metal dome 166*c* and the contact 161*a*3 is increased, the processor (not shown) may stop the displaying of the additional information on the screen of the display device 200.

The processor (not shown) may continuously output the control signal corresponding to the stopping of the displaying of the additional information on the display device 200 in response to an increase in the contact time between the other surface of the metal dome 166*c* and the contact 161*a*3 using at least one of the infrared diode 150 and the local area communication part (not shown).

The display device 200 may continuously receive the control signal transmitted from the remote controller 100 using at least one of the light receiving part (not shown) and the local area communication part (not shown). The controller (not shown) of the display device 200 may stop the displaying of the additional information on the screen in response to the received control signal.

The second extending portion 121*k*2 of the tilt switch 121*k* may be close to the first protrusion 171*a* corresponding to the second extending portion 121*k*2. The spaced distance between the second extending portion 121*k*2 of the tilt switch 121*k* and the first protrusion 171*a* corresponding to the second extending portion 121*k*2 in FIG. 8C may be shorter than the spaced distance between the second extending portion 121*k*2 of the tilt switch 121*k* and the first protrusion 171*a* corresponding to the second extending portion 121*k*2 in FIG. 8A. Also, the spaced distance between the second extending portion 121*k*2 of the tilt switch 121*k* and the first protrusion 171*a* corresponding to the second extending portion 121*k*2 in FIG. 8C may be shorter than the spaced distance between the second extending portion 121*k*2 of the tilt switch 121*k* and the first protrusion 171*a* corresponding to the second extending portion 121*k*2 in FIG. 8B.

The second protrusion 171*b* of the rubber 170 corresponding to the second extending portion 121*k*2 of the tilt switch 121*k* is in the spaced state from the one surface of the metal dome 166*a*. Also, the second protrusion 171*b* of the rubber 170 corresponding to the second extending portion 121*k*2 of the tilt switch 121*k* may be in contact with the one surface of the metal dome 166*a*. The other surface of the metal dome 166*a* is spaced apart from the contact 161*a*1.

The third extending portion 121*k*3 of the tilt switch 121*k* may be close to the first protrusion 171*a* corresponding to the third extending portion 121*k*3. The spaced distance between the third extending portion 121*k*3 of the tilt switch 121*k* and the first protrusion 171*a* corresponding to the third extending portion 121*k*3 in FIG. 8C may be shorter than the spaced distance between the third extending portion 121*k*3 of the tilt switch 121*k* and the first protrusion 171*a* corresponding to the third extending portion 121*k*3 in FIG. 8A. Also, the spaced distance between the third extending portion 121*k*3 of the tilt switch 121*k* and the first protrusion 171*a* corresponding to the third extending portion 121*k*3 in FIG. 8C may be shorter than the spaced distance between the third extending portion 121*k*3 of the tilt switch 121*k* and the first protrusion 171*a* corresponding to the third extending portion 121*k*3 in FIG. 8B.

The second protrusion 171*b* of the rubber 170 corresponding to the third extending portion 121*k*3 of the tilt switch 121*k* is in the spaced state from the one surface of the metal dome 166*b*. Also, the second protrusion 171*b* of the rubber 170 corresponding to the third extending portion 121*k*3 of the tilt switch 121*k* may be in contact with the one surface of the metal dome 166*b*. The other surface of the metal dome 166*b* is spaced apart from the contact 161*a*2.

When the additional information corresponding to a user's selection is displayed on the display device 200, the user may remove the external force applied to the first extending portion 121*k*1 of the tilt switch 121*k*.

When the external force applied to the first extending portion 121*k*1 of the tilt switch 121*k* is removed, the tilt switch 121*k* may be restored from a state of FIG. 8C into a state of FIG. 8A by the elasticity of at least one of the rubber 170 and the metal dome 166*c* corresponding to the fourth extending portion 121*k*4 of the tilt switch 121*k*.

The remote controller which can control the display device using the tilt switch can be provided.

The remote controller in which each of the different functions of the display device can be controlled using the plurality of extending portions of the tilt switch can be provided.

The remote controller which can control the display device through an increase and a decrease in an adjustment value using the tilt switch having forward and backward moving and pressing functions can be provided.

The remote controller in which a plurality of functions of the display device can be controlled according to the contacts of the plurality of extending portions of the tilt switch which are built in and arranged can be provided.

The remote controller having the tilt switch which is protrudingly disposed to allow the user's operation to be easy and performs the forward and backward moving and pressing motions can be provided.

The remote controller having the tilt switch which is disposed to protrude higher than other push buttons and thus to allow the user's operation to be easy and performs the forward and backward moving and pressing motions can be provided.

The remote controller having the tilt switch disposed in the form of a bar type button extending vertically or horizontally to allow the user's operation to be easy can be provided.

According to the various embodiments of the present disclosure which is not limited thereto, the remote controller which can control the display device using the tilt switch can be provided.

The methods according to the exemplary embodiments of the present disclosure may be provided in a form of program commands executable through various computer means and recorded in a computer-readable recording medium. Here, the computer-readable recording medium may include a program command, data file, data structure, and any combination thereof. The computer-readable recording medium may include hardware devices specially designed to store and execute programs such as magnetic media (hard disk, floppy disk, and magnetic tape), optical media (Compact Disc-Read Only Memory (CD-ROM) and Digital Versatile Disc (DVD)), magneto-optical media (floptical disk), Read Only Memory (ROM), Random Access Memory (RAM), and flash memory. The memory which can be included in the remote controller may be an example of a program including indications for implementing the embodiments of the present disclosure or a storage medium appropriate for storing the programs to be read by a machine. In the meantime, the program command recorded in the computer-readable recording medium may be one specially designed for the embodiments of the present disclosure or one disclosed in the art of computer software. Further, the program command may include a high level language code executable by a computer having an interpreter as well as a machine language code provided by a complier. The hardware device may be configured with at least one software module to perform operations according to various embodiments of the present disclosure.

While the present disclosure has been described with reference to exemplary embodiments, it is to be understood that the disclosure is not limited to the disclosed exemplary embodiments and can be variously changed and modified by those skilled in the art.

Therefore, the scope of the present disclosure is not limited by the above-described exemplary embodiments but should be defined by the appended claims and their equivalents.

What is claimed is:

1. A remote controller comprising:
a housing including a through-hole;
a tilt switch configured to receive a user's input and having a main extending portion extending in a direction and disposed to protrude to an outside of the housing and a plurality of sub-extending portions extending in directions different from the direction of the main extending portion and built in the housing;
a non-conductive elastic portion including a protrusion located at a lower end of each of the plurality of sub-extending portions and formed at a position facing each of the plurality of sub-extending portions;
a conductive elastic portion disposed at a lower end of the non-conductive elastic portion, formed at a position facing the protrusion and configured to be in contact with a surface of the protrusion; and
a printed circuit board disposed at a lower end of the conductive elastic portion and on which a plurality of contacts disposed at positions opposite to the conductive elastic portion and a plurality of electronic components are mounted,
wherein the non-conductive elastic portion, the conductive elastic portion and the printed circuit board are disposed, in turn, at lower ends of the sub-extending portions in the housing, and
wherein the tilt switch further includes a rotational shaft and is inclined with respect to the rotational shaft by the user's input.

2. A remote controller comprising:
a housing including a through-hole;
a tilt switch accommodated in the housing and including a first extending portion extending in a direction and configured to receive a user's input, a second extending portion extending and protruding in a direction different from the direction of the first extending portion, a third extending portion extending and protruding in a direction different from the direction of the second extending portion, and a fourth extending portion extending and protruding in a direction different from the direction of the first extending portion;
a rubber located under the second extending portion, the third extending portion and the fourth extending portion and including a first protrusion formed at positions opposite to the second extending portion and the third extending portion to protrude and a second protrusion protruding in a direction opposite to a protruding direction of the first protrusion;
a plurality of metal domes located under the second protrusion and configured to be in contact with one surface of the second protrusion; and
a plurality of contacts mounted on a printed circuit board, located under the plurality of metal domes and configured to be in contact with the other surfaces of the plurality of metal domes,
wherein a part of the first extending portion is exposed to an outside through the through-hole, and
wherein the tilt switch further includes a rotational shaft and is inclined with respect to the rotational shaft by the user's input.

3. The remote controller according to claim 2, wherein a tiltable angle of the tilt switch is determined by one of a width of the through-hole, a height of the first protrusion and a height between the second protrusion and a contact of the plurality of contacts.

4. The remote controller according to claim 2, wherein a protruding direction of the fourth extending portion is opposite to that of the first extending portion.

5. The remote controller according to claim 2, wherein a height of the first protrusion of the rubber is different from that of the second protrusion.

6. The remote controller according to claim 2, wherein the first protrusion includes a plurality of protrusions corresponding to the second extending portion and the third extending portion, respectively.

7. The remote controller according to claim 2, wherein the second protrusion includes a plurality of protrusions corresponding to the second extending portion, the third extending portion and the fourth extending portion, respectively.

8. The remote controller according to claim 2, wherein, when the tilt switch is inclined by the user's input received through the first extending portion and a first metal dome of the plurality of metal domes corresponding to the second extending portion and a first contact of the plurality of contacts corresponding to the first metal dome are in contact with each other, the fourth extending portion is spaced apart from a third metal dome corresponding to the fourth extending portion.

9. The remote controller according to claim 2, wherein, when the tilt switch is inclined by the user's input received through the first extending portion and a second metal dome of the plurality of metal domes corresponding to the third extending portion and a second contact of the plurality of contacts corresponding to the second metal dome are in contact with each other, the fourth extending portion is spaced apart from a third metal dome of the plurality of metal domes corresponding to the fourth extending portion.

10. The remote controller according to claim 2, wherein, when the tilt switch is moved by the user's input received through the first extending portion and a third metal dome of the plurality of metal domes corresponding to the fourth extending portion and a third contact of the plurality of contacts corresponding to the third metal dome are in contact with each other, the second extending portion is spaced apart from a first metal dome of the plurality of metal domes corresponding to the second extending portion, and the third extending portion is spaced apart from a second metal dome of the plurality of metal domes corresponding to the third extending portion.

11. The remote controller according to claim 2, wherein a thickness of the rubber is greater than a thickness of each of the plurality of metal domes.

12. The remote controller according to claim 2, wherein the second extending portion of the tilt switch is inclined by the user's input received through the first extending portion and presses a first protrusion corresponding to the second extending portion.

13. The remote controller according to claim 2, wherein the third extending portion of the tilt switch is inclined by the user's input received through the first extending portion and presses a first protrusion corresponding to the third extending portion.

14. The remote controller according to claim 2, wherein a function of a display device corresponding to the fourth extending portion is different from a function of the display device corresponding to the second extending portion and a function of the display device corresponding to the third extending portion.

15. A remote controller comprising:
a housing including a through-hole;
a tilt switch installed at the housing to be tilted and linearly moved and including an extending portion of which at least a part extends in a direction to an outside of the housing through the through-hole and a first pressing portion, a second pressing portion and a third pressing portion extending in the housing in directions different from the direction of the extending portion;
a rubber located under the tilt switch to be pressed by at least one of the first pressing portion, the second pressing portion and the third pressing portion according to movement of the tilt switch;
a first metal dome, a second metal dome and a third metal dome located under the rubber so that one surface of each of the metal domes is contactable with the rubber and corresponding to the first pressing portion, the second pressing portion and the third pressing portion, respectively; and
a first contact, a second contact and a third contact located under the metal domes to correspond to the first metal dome, the second metal dome and the third metal dome, respectively,
wherein the first pressing portion presses the rubber in response to tilting of the tilt switch so that the first metal dome is in contact with the first contact, and
the third pressing portion presses the rubber so that the third metal dome is in contact with the third contact when the tilt switch is linearly moved, and
wherein the tilt switch further includes a rotational shaft, and the first pressing portion and the second pressing portion extend in opposite directions to each other with respect to the rotational shaft, and the third pressing portion extends between the first pressing portion and the second pressing portion in a direction opposite to the direction of the extending portion.

16. The remote controller according to claim 15, wherein the rubber includes a first protrusion located to correspond to the first pressing portion and protruding toward the first metal dome, a second protrusion located to correspond to the second pressing portion and protruding toward the second metal dome and a third protrusion located to correspond to the third pressing portion and protruding toward the third metal dome.

17. The remote controller according to claim 16, wherein a distance between the third protrusion and the third contact is shorter than a distance between the first protrusion and the first contact.

18. The remote controller according to claim 15, wherein, when the tilt switch is linearly moved, the first metal dome of the tilt switch is spaced apart from the first contact.

* * * * *